(12) United States Patent
Mori et al.

(10) Patent No.: US 10,475,947 B2
(45) Date of Patent: Nov. 12, 2019

(54) PHOTOVOLTAIC DEVICE AND METHOD OF MANUFACTURING SAME

(71) Applicant: SHARP KABUSHIKI KAISHA, Sakai, Osaka (JP)

(72) Inventors: Takeshi Mori, Sakai (JP); Yuta Matsumoto, Sakai (JP); Yoshitaka Zenitani, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/759,661

(22) PCT Filed: Aug. 18, 2016

(86) PCT No.: PCT/JP2016/074093
§ 371 (c)(1),
(2) Date: Mar. 13, 2018

(87) PCT Pub. No.: WO2017/047318
PCT Pub. Date: Mar. 23, 2017

(65) Prior Publication Data
US 2019/0044017 A1 Feb. 7, 2019

(30) Foreign Application Priority Data
Sep. 16, 2015 (JP) .................................. 2015-182713

(51) Int. Cl.
*H01L 31/18* (2006.01)
*H01L 31/0747* (2012.01)
(Continued)

(52) U.S. Cl.
CPC .... *H01L 31/0747* (2013.01); *H01L 31/02167* (2013.01); *H01L 31/02363* (2013.01);
(Continued)

(58) Field of Classification Search
CPC . H01L 31/02363; H01L 31/075; H01L 31/18; H01L 31/022441; H01L 31/02167; H01L 31/0747
See application file for complete search history.

(56) References Cited

U.S. PATENT DOCUMENTS 6,222,117 B1 * 4/2001 Shiozaki ............. H01L 31/0236
136/255
6,506,622 B1 * 1/2003 Shiozaki ............. H01L 31/0236
136/255
(Continued)

FOREIGN PATENT DOCUMENTS

CN          101231947 A     7/2008
JP          2005-166641 A   6/2005
(Continued)

*Primary Examiner* — Golam Mowla
(74) *Attorney, Agent, or Firm* — ScienBiziP, P.C.

(57) ABSTRACT

A photovoltaic device includes a liquid-repelling layer between the edges of a first amorphous semiconductor layer and the edges of a second amorphous semiconductor layer. No such a liquid-repelling layer is provided between the first amorphous semiconductor layer and the second amorphous semiconductor layer, except between the edges of the first amorphous semiconductor layer and the edges of the second amorphous semiconductor layer. The semiconductor layer in the photovoltaic device is therefore precisely patterned.

9 Claims, 12 Drawing Sheets

(51) Int. Cl.
*H01L 31/0236* (2006.01)
*H01L 31/075* (2012.01)
*H01L 31/0216* (2014.01)
*H01L 31/0224* (2006.01)

(52) U.S. Cl.
CPC .... *H01L 31/022441* (2013.01); *H01L 31/075* (2013.01); *H01L 31/18* (2013.01); *Y02E 10/50* (2013.01)

(56) References Cited

U.S. PATENT DOCUMENTS

| | | | | |
|---|---|---|---|---|
| 7,612,283 | B2* | 11/2009 | Toyomura | H01L 31/02021 |
| | | | | 136/244 |
| 7,883,764 | B2* | 2/2011 | Murao | B29C 37/0053 |
| | | | | 264/496 |
| 2002/0043659 | A1* | 4/2002 | Kondo | H01L 29/0657 |
| | | | | 257/53 |
| 2005/0106419 | A1 | 5/2005 | Endoh et al. | |
| 2005/0172996 | A1* | 8/2005 | Hacke | H01L 31/02245 |
| | | | | 136/256 |
| 2012/0325309 | A1* | 12/2012 | Takahama | H01L 31/022441 |
| | | | | 136/256 |
| 2013/0149454 | A1* | 6/2013 | Hara | C09C 1/40 |
| | | | | 427/385.5 |
| 2014/0158213 | A1* | 6/2014 | Usui | B08B 17/02 |
| | | | | 137/13 |
| 2015/0243806 | A1* | 8/2015 | Hu | H01L 31/02363 |
| | | | | 438/71 |

FOREIGN PATENT DOCUMENTS

| | | |
|---|---|---|
| JP | 2010-103202 A | 5/2010 |
| JP | 2013-211385 A | 10/2013 |
| JP | 2013-211392 A | 10/2013 |
| JP | 2013-239476 A | 11/2013 |

* cited by examiner (A)

(B)

PHOTOVOLTAIC DEVICE AND METHOD OF MANUFACTURING SAME

TECHNICAL FIELD

The present application hereby claims priority to Japanese Patent Application, Tokugan, No. 2015-182713 filed Sep. 16, 2015, the entire contents of which are hereby incorporated herein by reference.

The present invention, in an aspect thereof, relates to photovoltaic devices and methods of manufacturing photovoltaic devices.

BACKGROUND ART

Photovoltaic devices, capable of converting sunlight and other forms of light energy to electric energy, are increasingly expected as a next-generation energy source in view of global environmental problems. Some known photovoltaic devices have a heterojunction back-contact structure in which electrodes, a p-type semiconductor layer, and an n-type semiconductor layer are formed on a back face of a semiconductor substrate opposite a light-incident face thereof to improve efficiency of conversion of light energy to electric energy (see, for example, Patent Literature 1). Patent Literature 1 discloses a method of manufacturing a photovoltaic device that involves a step of patterning a p-type semiconductor layer and an n-type semiconductor layer on a back face of a substrate by using an etching paste.

CITATION LIST

Patent Literature

Patent Literature 1: Japanese Unexamined Patent Application Publication, Tokukai, No. 2013-239476

SUMMARY OF INVENTION

Technical Problem

However, an etching paste, when applied, for example, onto the p-type semiconductor layer, spreads well on the p-type semiconductor layer (showing relatively high wettability). It is therefore difficult to perform precise patterning of the p-type semiconductor layer.

In view of this problem, it is an object of an aspect of the present invention to provide a photovoltaic device including a precisely patterned semiconductor layer and a method of manufacturing such a photovoltaic device.

Solution to Problem

The present invention, in a first aspect thereof, is directed to a photovoltaic device including: a semiconductor substrate having a first face and a second face opposite the first face; a first amorphous semiconductor layer of a first conductivity type provided on the second face; and a second amorphous semiconductor layer of a second conductivity type provided on the second face, the second conductivity type differing from the first conductivity type. The second amorphous semiconductor layer has edges thereof over edges of the first amorphous semiconductor layer. The photovoltaic device in accordance with the first aspect of the present invention further includes a liquid-repelling layer provided between the edges of the first amorphous semiconductor layer and the edges of the second amorphous semiconductor layer. No such a liquid-repelling layer is provided between the first amorphous semiconductor layer and the second amorphous semiconductor layer, except between the edges of the first amorphous semiconductor layer and the edges of the second amorphous semiconductor layer. The photovoltaic device in accordance with the first aspect of the present invention further includes: first electrodes provided in electric connection with the first amorphous semiconductor layer on the second face; and second electrodes provided in electric connection with the second amorphous semiconductor layer on the second face.

The present invention, in a second aspect thereof, is directed to a photovoltaic device including: a semiconductor substrate having a first face and a second face opposite the first face; a p-type, first amorphous semiconductor layer provided on the second face; and an n-type, second amorphous semiconductor layer provided on the second face. The second amorphous semiconductor layer has edges thereof over edges of the first amorphous semiconductor layer. The photovoltaic device in accordance with the second aspect of the present invention further includes an n-type semiconductor layer provided between the edges of the first amorphous semiconductor layer and the edges of the second amorphous semiconductor layer. No such an n-type semiconductor layer is provided between the first amorphous semiconductor layer and the second amorphous semiconductor layer, except between the edges of the first amorphous semiconductor layer and the edges of the second amorphous semiconductor layer. The photovoltaic device in accordance with the second aspect of the present invention further includes: first electrodes provided in electric connection with the first amorphous semiconductor layer on the second face; and second electrodes provided in electric connection with the second amorphous semiconductor layer on the second face.

The present invention, in a third aspect thereof, is directed to a photovoltaic device including: a semiconductor substrate having a first face and a second face opposite the first face; a first amorphous semiconductor layer of a first conductivity type provided on the second face; and a second amorphous semiconductor layer of a second conductivity type provided on the second face, the second conductivity type differing from the first conductivity type. The second amorphous semiconductor layer has edges thereof over edges of the first amorphous semiconductor layer. The photovoltaic device in accordance with the third aspect of the present invention further includes an i-type semiconductor layer provided between the edges of the first amorphous semiconductor layer and the edges of the second amorphous semiconductor layer. No such an i-type semiconductor layer is provided between the first amorphous semiconductor layer and the second amorphous semiconductor layer, except between the edges of the first amorphous semiconductor layer and the edges of the second amorphous semiconductor layer. The photovoltaic device in accordance with the third aspect of the present invention further includes: first electrodes provided in electric connection with the first amorphous semiconductor layer on the second face; and second electrodes provided in electric connection with the second amorphous semiconductor layer on the second face.

The present invention, in a fourth aspect thereof, is directed to a photovoltaic device including: a semiconductor substrate having a first face and a second face opposite the first face; a first amorphous semiconductor layer of a first conductivity type provided on the second face; and a second amorphous semiconductor layer of a second conductivity type provided on the second face, the second conductivity type differing from the first conductivity type. The second amorphous semiconductor layer has edges thereof over edges of the first amorphous semiconductor layer. The photovoltaic device in accordance with the fourth aspect of the present invention further includes a silicon nitride layer provided between the edges of the first amorphous semiconductor layer and the edges of the second amorphous semiconductor layer. No such a silicon nitride layer is provided between the first amorphous semiconductor layer and the second amorphous semiconductor layer, except between the edges of the first amorphous semiconductor layer and the edges of the second amorphous semiconductor layer. The photovoltaic device in accordance with the fourth aspect of the present invention further includes: first electrodes provided in electric connection with the first amorphous semiconductor layer on the second face; and second electrodes provided in electric connection with the second amorphous semiconductor layer on the second face.

The present invention, in a fifth aspect thereof, is directed to a method of manufacturing a photovoltaic device, the method including: preparing a semiconductor substrate having a first face and a second face opposite the first face; and forming a first amorphous semiconductor layer of a first conductivity type on the second face of the semiconductor substrate. The method of manufacturing a photovoltaic device in accordance with the fifth aspect of the present invention further includes: forming a liquid-repelling layer on the first amorphous semiconductor layer; applying an etching paste to the liquid-repelling layer; and removing parts of the liquid-repelling layer and the first amorphous semiconductor layer using the etching paste. The method of manufacturing a photovoltaic device in accordance with the fifth aspect of the present invention further includes: forming a second amorphous semiconductor layer of a second conductivity type above the first amorphous semiconductor layer and on those parts of the second face of the semiconductor substrate from which the first amorphous semiconductor layer has been removed, the second conductivity type differing from the first conductivity type; removing parts of the second amorphous semiconductor layer; and removing parts of the liquid-repelling layer. The method of manufacturing a photovoltaic device in accordance with the fifth aspect of the present invention further includes: providing first electrodes in electric connection with the first amorphous semiconductor layer on the second face; and providing second electrodes in electric connection with the second amorphous semiconductor layer on the second face.

Advantageous Effects of Invention

The present invention, in the first to fourth aspects thereof, provides a photovoltaic device including a precisely patterned semiconductor layer.

The present invention, in the fifth aspect thereof, provides a method of manufacturing a photovoltaic device including a precisely patterned semiconductor layer.

DESCRIPTION OF EMBODIMENTS

Embodiment 1

Figure 1:
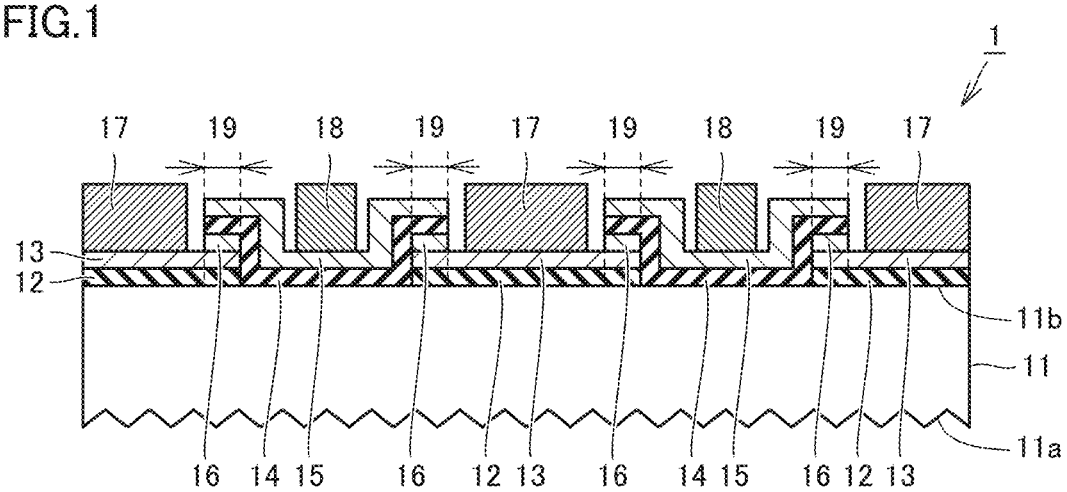
FIG. 1 is a schematic cross-sectional view of a photovoltaic device in accordance with Embodiment 1.

A photovoltaic device 1 in accordance with Embodiment 1 will be described in reference to FIG. 1. The photovoltaic device 1 of the present embodiment primarily includes a semiconductor substrate 11, a first amorphous semiconductor layer 13, a second amorphous semiconductor layer 15, a liquid-repelling layer 16, first electrodes 17, and second electrodes 18.

The semiconductor substrate 11 may be either an n- or p-type semiconductor substrate. The semiconductor substrate 11 is an n-type monocrystal silicon substrate in the present embodiment. The semiconductor substrate 11 has a first face 11a and a second face 11b opposite the first face 11a.

The semiconductor substrate 11 has an irregular structure on the first face 11a. Light enters the photovoltaic device 1 through the first face 11a. The provision of the irregular structure on the first face 11a, which is a light-incident face, of the semiconductor substrate 11 can reduce reflection of incident light on the first face 11a of the semiconductor substrate 11, enabling admission of more light into the photovoltaic device 1. That in turn can improve efficiency of conversion of light energy to electric energy in the photovoltaic device 1.

The first amorphous semiconductor layer 13 is provided on the second face 11b of the semiconductor substrate 11. The first amorphous semiconductor layer 13 is of a first conductivity type. The first amorphous semiconductor layer 13 may be either an n- or p-type amorphous semiconductor layer. The first amorphous semiconductor layer 13 is made from a p-type amorphous silicon film in the present embodiment. Throughout the present specification, an "amorphous semiconductor" refers not only to an amorphous semiconductor containing atoms with a dangling bond (not bonded to a hydrogen), but also to hydrogenated amorphous silicon or another like semiconductor containing atoms with no dangling bonds left (atoms bonded to a hydrogen). The first amorphous semiconductor layer 13 may be provided in the form of stripes extending perpendicular to the plane of the paper on which FIG. 1 is drawn.

The first electrodes 17 are provided on the second face 11b of the semiconductor substrate 11. More specifically, the first electrodes 17 are provided on the first amorphous semiconductor layer 13 in the form of stripes extending perpendicular to the plane of the paper on which FIG. 1 is drawn. The first electrodes 17 are electrically connected to the first amorphous semiconductor layer 13. The first electrodes 17 are, for example, metal electrodes. The first electrodes 17 are made of silver (Ag) in the present embodiment. The first electrodes 17 may be p-type electrodes in the present embodiment.

The second amorphous semiconductor layer 15 is provided on the second face 11b of the semiconductor substrate 11. The second amorphous semiconductor layer 15 is of a second conductivity type that differs from the first conductivity type to which the first amorphous semiconductor layer 13 belongs. The second amorphous semiconductor layer 15 may be either an n- or p-type amorphous semiconductor layer. The second amorphous semiconductor layer 15 is made from an n-type amorphous silicon film in the present embodiment. The second amorphous semiconductor layer 15 may be provided in the form of stripes extending perpendicular to the plane of the paper on which FIG. 1 is drawn.

The second amorphous semiconductor layer 15 has edges thereof over the edges of the first amorphous semiconductor layer 13 in the present embodiment. The edges of the second amorphous semiconductor layer 15 are positioned above the edges of the first amorphous semiconductor layer 13. Each edge of the first amorphous semiconductor layer 13 is a part of an edge region 19 of the first amorphous semiconductor layer 13 in the present specification. Each edge of the second amorphous semiconductor layer 15 is a part of an edge region 19 of the second amorphous semiconductor layer 15 in the present specification.

The second electrodes 18 are provided on the second face 11b of the semiconductor substrate 11. More specifically, the second electrodes 18 are provided on the second amorphous semiconductor layer 15 in the form of stripes extending perpendicular to the plane of the paper on which FIG. 1 is drawn. The second electrodes 18 are electrically connected to the second amorphous semiconductor layer 15. The second electrodes 18 are, for example, metal electrodes. The second electrodes 18 are made of silver (Ag) in the present embodiment. The second electrodes 18 may be n-type electrodes in the present embodiment.

In the photovoltaic device 1 of the present embodiment, the first electrodes 17 and the second electrodes 18 are provided on the second face 11b of the semiconductor substrate 11, rather than on the first face 11a, which is a light-incident face, of the semiconductor substrate 11. In the photovoltaic device 1 of the present embodiment, the first electrodes 17 and the second electrodes 18 do not block the light striking the photovoltaic device 1. The photovoltaic device 1 of the present embodiment can therefore produce a high short-circuit current $J_{SC}$, thereby improving efficiency of conversion of light energy to electric energy.

The photovoltaic device 1 of the present embodiment includes the liquid-repelling layer 16 between the edges of the first amorphous semiconductor layer 13 and the edges of the second amorphous semiconductor layer 15. No liquid-repelling layer 16 may be provided between the first amorphous semiconductor layer 13 and the second amorphous semiconductor layer 15, except between the edges of the first amorphous semiconductor layer 13 and the edges of the second amorphous semiconductor layer 15. The liquid-repelling layer 16 may be made of a material on which an etching paste 21 spreads less than on the first amorphous semiconductor layer 13 of the first conductivity type. In other words, the liquid-repelling layer 16 may be made of such a material that the contact angle between the surface of the liquid-repelling layer 16 and the etching paste 21 is greater than the contact angle between the surface of the first amorphous semiconductor layer 13 of the first conductivity type and the etching paste 21. When the first amorphous semiconductor layer 13 is of a p-type as in the present embodiment, the liquid-repelling layer 16 is, for example, an n-type semiconductor layer, more specifically an n-type silicon layer.

The etching paste 21 is used in the present embodiment for the patterning of the first amorphous semiconductor layer 13 of the first conductivity type. Instead, another flowable patterning agent may be used. In such cases, the liquid-repelling layer 16 may be made of a material on which the flowable patterning agent spreads less than on the first amorphous semiconductor layer 13 of the first conductivity type.

There may be provided a first i-type amorphous semiconductor layer 12 between the semiconductor substrate 11 and the first amorphous semiconductor layer 13. There may be provided a second i-type amorphous semiconductor layer 14 between the semiconductor substrate 11 and the second amorphous semiconductor layer 15. The first i-type amorphous semiconductor layer 12 and the second i-type amorphous semiconductor layer 14 can restrict the carriers generated in the semiconductor substrate 11 by the light entering the semiconductor substrate 11 through the first face 11a from recombining on the second face 11b of the semiconductor substrate 11. Throughout the present specification, an "i-type semiconductor" refers not only to a completely intrinsic semiconductor, but also to a semiconductor contaminated with an n- or p-type impurity of a sufficiently low concentration (both the n-type impurity concentration and the p-type impurity concentration are lower than $1 \times 10^{15}$ atoms/cm$^3$). The first i-type amorphous semiconductor layer 12 and the second i-type amorphous semiconductor layer 14 are i-type amorphous silicon films in the present embodiment.

The second i-type amorphous semiconductor layer 14 and the second amorphous semiconductor layer 15 have edges thereof over the edges of the first i-type amorphous semiconductor layer 12 and the edges of the first amorphous semiconductor layer 13 in the photovoltaic device 1 of the present embodiment. Each edge of the first i-type amorphous semiconductor layer 12 is a part of an edge region 19 of the first i-type amorphous semiconductor layer 12 in the present specification. Each edge of the second i-type amorphous semiconductor layer 14 is a part of an edge region 19 of the second i-type amorphous semiconductor layer 14 in the present specification. The edges of the second i-type amorphous semiconductor layer 14 and the edges of the second amorphous semiconductor layer 15 are positioned above the first amorphous semiconductor layer 13.

The liquid-repelling layer 16 is provided between the edges of the first amorphous semiconductor layer 13 and the edges of the second i-type amorphous semiconductor layer 14. No liquid-repelling layer 16 may be provided between the first amorphous semiconductor layer 13 and the second i-type amorphous semiconductor layer 14, except the edges of the first amorphous semiconductor layer 13 and the edges of the second i-type amorphous semiconductor layer 14.

The edges of the second i-type amorphous semiconductor layer 14 are in contact with both the first amorphous semiconductor layer 13 and the second amorphous semiconductor layer 15. The first amorphous semiconductor layer 13 and the second amorphous semiconductor layer 15 are isolated from each other by the second i-type amorphous semiconductor layer 14. In other words, the first amorphous semiconductor layer 13 is not in contact with the second amorphous semiconductor layer 15. This structure can therefore improve efficiency of conversion of light energy to electric energy in the photovoltaic device 1.

The semiconductor substrate 11, in the photovoltaic device 1 of the present embodiment, is in contact with either the first amorphous semiconductor layer 13 and the second amorphous semiconductor layer 15 or the first i-type amorphous semiconductor layer 12 and the second i-type amorphous semiconductor layer 14. The semiconductor substrate 11 forms a heterojunction with an amorphous semiconductor layer (either the first amorphous semiconductor layer 13 and the second amorphous semiconductor layer 15 or the first i-type amorphous semiconductor layer 12 and the second i-type amorphous semiconductor layer 14) in the photovoltaic device 1 of the present embodiment. The resultant photovoltaic device 1 therefore exhibits improved passivation and produces high open circuit voltage $V_{OC}$. The photovoltaic device 1 of the present embodiment can therefore improve efficiency of conversion of light energy to electric energy.

Referring to FIGS. 2 to 13, the following will describe an exemplary method of manufacturing the photovoltaic device 1 in accordance with the present embodiment.

Figure 2:
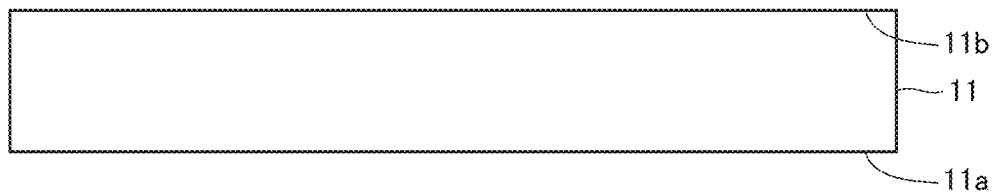
FIG. 2 is a schematic cross-sectional view showing one of steps of a method of manufacturing a photovoltaic device in accordance with Embodiments 1 to 4.
Figure 3:
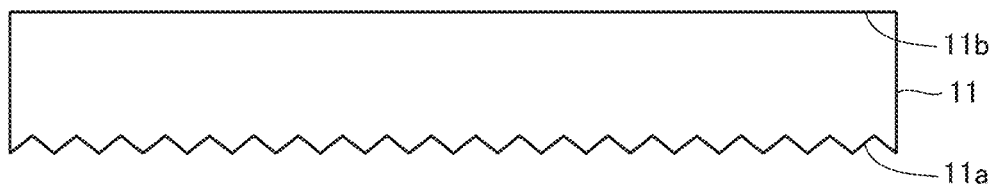
FIG. 3 is a schematic cross-sectional view showing a step next to the one shown in FIG. 2 in the method of manufacturing a photovoltaic device in accordance with Embodiments 1 to 4.

As shown in FIG. 2, a semiconductor substrate 11 is prepared that has a first face 11a and a second face 11b opposite the first face 11a. As shown in FIG. 3, an irregular structure is formed on the first face 11a of the semiconductor substrate 11. The irregular structure may be formed on the first face 11a of the semiconductor substrate 11, for example, by anisotropic etching of the first face 11a of the semiconductor substrate 11 (n-type monocrystal silicon substrate) using potassium hydroxide (KOH).

Figure 4:
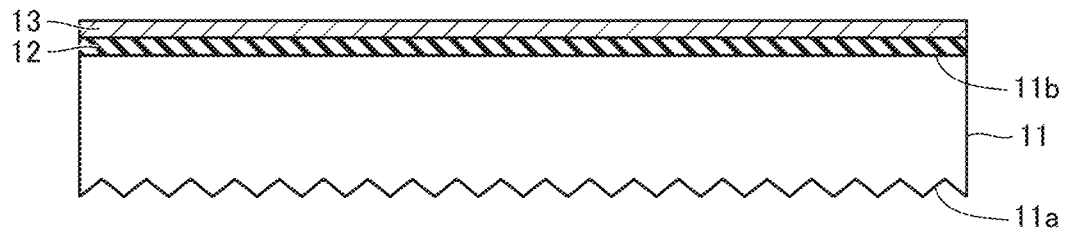
FIG. 4 is a schematic cross-sectional view showing a step next to the one shown in FIG. 3 in the method of manufacturing a photovoltaic device in accordance with Embodiments 1 to 4.

As shown in FIG. 4, a first amorphous semiconductor layer 13 of the first conductivity type is formed on the second face 11b of the semiconductor substrate 11. To manufacture the photovoltaic device 1 including a first i-type amorphous semiconductor layer 12 between the semiconductor substrate 11 and the first amorphous semiconductor layer 13, the first i-type amorphous semiconductor layer 12 may be formed on the second face 11b of the semiconductor substrate 11 prior to the formation of the first amorphous semiconductor layer 13, and the first amorphous semiconductor layer 13 may then be formed on the first i-type amorphous semiconductor layer 12. The first i-type amorphous semiconductor layer 12 and the first amorphous semiconductor layer 13 of the first conductivity type may be formed by plasma chemical vapor deposition (CVD) or any other method.

Figure 5:
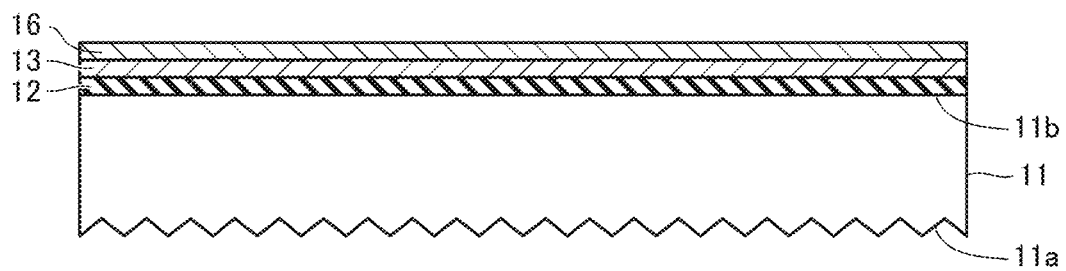
FIG. 5 is a schematic cross-sectional view showing a step next to the one shown in FIG. 4 in the method of manufacturing a photovoltaic device in accordance with Embodiment 1.

As shown in FIG. 5, a liquid-repelling layer 16 is formed on the first amorphous semiconductor layer 13. The liquid-repelling layer 16 is made of a material on which the etching paste 21 spreads less than on the first amorphous semiconductor layer 13 of the first conductivity type. In other words, the liquid-repelling layer 16 is made of such a material that the contact angle between the surface of the liquid-repelling layer 16 and the etching paste 21 is greater than the contact angle between the surface of the first amorphous semiconductor layer 13 of the first conductivity type and the etching paste 21. The liquid-repelling layer 16 is, for example, an n-type semiconductor layer, more specifically an n-type silicon layer. The liquid-repelling layer 16 may be formed by plasma chemical vapor deposition (CVD) or any other method. The etching paste 21 is used in the present embodiment for the patterning of the first amorphous semiconductor layer 13 of the first conductivity type. Instead, another flowable patterning agent may be used. In such cases, the liquid-repelling layer 16 may be made of a material on which the flowable patterning agent spreads less than on the first amorphous semiconductor layer 13 of the first conductivity type.

Figure 6:
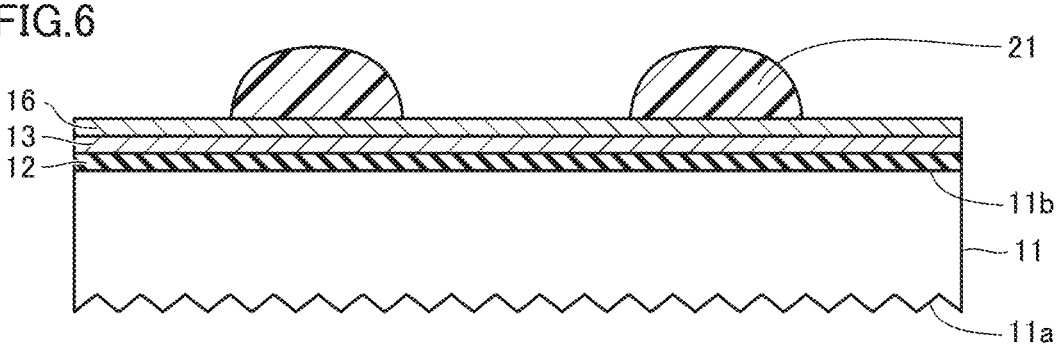
FIG. 6 is a schematic cross-sectional view showing a step next to the one shown in FIG. 5 in the method of manufacturing a photovoltaic device in accordance with Embodiment 1.
Figure 7:
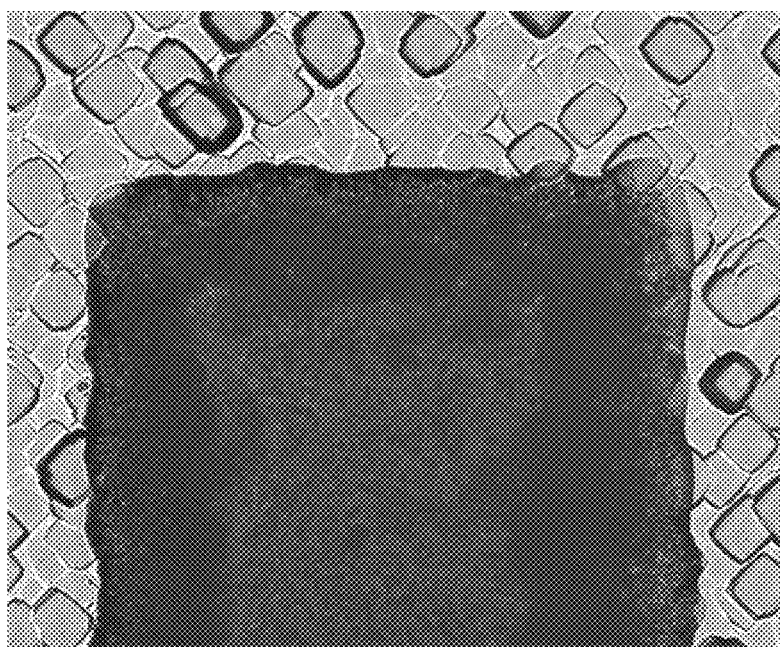
FIG. 7(A) is a drawing showing an enlarged partial photograph of a region to which an etching paste has been applied in the method of manufacturing a photovoltaic device in accordance with Embodiment 1.
FIG. 7(B) is a drawing showing an enlarged partial photograph of a region to which an etching paste has been applied in a method of manufacturing a photovoltaic device in accordance with a comparative example.
Figure 7:
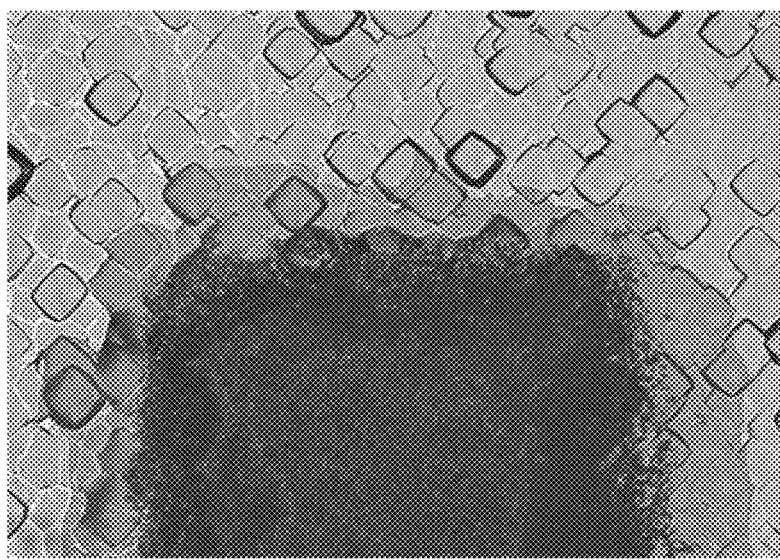

As shown in FIG. 6, the etching paste 21 is applied to parts of the liquid-repelling layer 16. The etching paste 21 contains a component capable of etching the liquid-repelling layer 16 and the first amorphous semiconductor layer 13. In the manufacture of the photovoltaic device 1 including the first i-type amorphous semiconductor layer 12, the etching paste 21 contains a component capable of etching the liquid-repelling layer 16, the first amorphous semiconductor layer 13, and the first i-type amorphous semiconductor layer 12. The etching paste 21 may be applied to the liquid-repelling layer 16, for example, by screen printing. The etching paste 21 is used in the present embodiment for the patterning of the first amorphous semiconductor layer 13 of the first conductivity type. Instead, another flowable patterning agent may be used.

Figure 8:
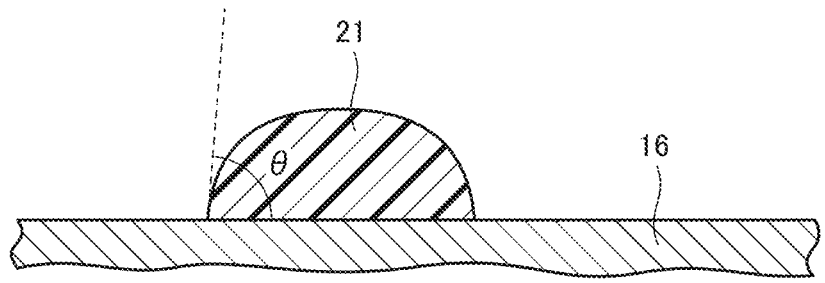
FIG. 8 is an enlarged schematic partial cross-sectional view showing the step shown in FIG. 6 in the method of manufacturing a photovoltaic device in accordance with Embodiment 1.

As shown in FIG. 7(A), the etching paste 21 is applied to the liquid-repelling layer 16 in the method of manufacturing the photovoltaic device 1 in accordance with the present embodiment. The liquid-repelling layer 16 is made of a material on which the etching paste 21 spreads less than on the first amorphous semiconductor layer 13. The liquid-repelling layer 16 is made of such a material that the contact angle between the surface of the liquid-repelling layer 16 and the etching paste 21 is greater than the contact angle between the surface of the first amorphous semiconductor layer 13 and the etching paste 21. This structure can make the etching paste 21 less likely to spread on the liquid-repelling layer 16 beyond a designed range, thereby achieving precise patterning of the first amorphous semiconductor layer 13 of the first conductivity type. As shown in FIG. 8, the contact angle, θ, between the surface of the liquid-repelling layer 16 and the etching paste 21 may be from 45° to 135° inclusive.

An exemplary component of the etching paste 21 capable of etching the liquid-repelling layer 16, the first amorphous semiconductor layer 13, and the first i-type amorphous semiconductor layer 12 is phosphoric acid. The component for etching the liquid-repelling layer 16, the first amorphous semiconductor layer 13, and the first i-type amorphous semiconductor layer 12 is preferably contained in an amount of from 10 mass % to 40 mass % inclusive relative to the total mass of the etching paste 21. If the component for etching the liquid-repelling layer 16, the first amorphous semiconductor layer 13, and the first i-type amorphous semiconductor layer 12 accounts for less than 10 mass % of the total mass of the etching paste 21, sufficient etching capability may not be achieved. If the component for etching the liquid-repelling layer 16, the first amorphous semiconductor layer 13, and the first i-type amorphous semiconductor layer 12 accounts for more than 40 mass % of the total mass of the etching paste 21, the etching paste 21 may have too low a viscosity, and it may become difficult to apply the etching paste 21 by printing. The etching paste 21 preferably has a viscosity of from 10 Pa·s to 40 Pa·s inclusive to achieve both adequate etching capability and printability.

The etching paste 21 may further contain water, an organic solvent, and a thickening agent. The organic solvent may be, for example, at least one of an alcohol such as ethylene glycol, an ether such as ethylene glycol monobutyl ether, an ester such as propylene carbonate, and a ketone such as N-methyl-2-pyrrolidone. The thickening agent may be, for example, at least one of a polyamide resin such as cellulose, ethyl cellulose, a cellulose derivative, and nylon 6 and a polymer containing polymerized vinyl groups such as polyvinylpyrrolidone.

Figure 9:
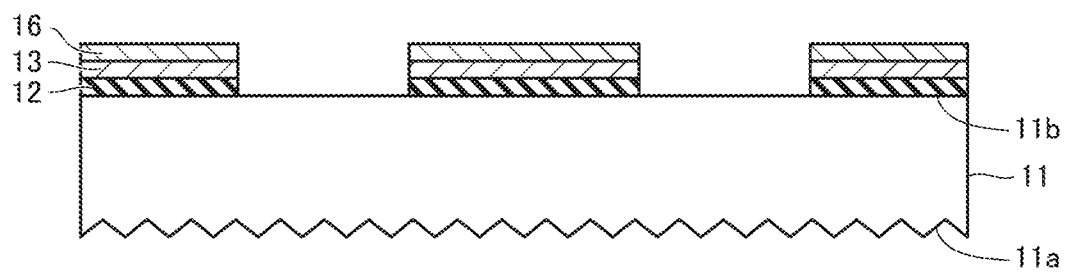
FIG. 9 is a schematic cross-sectional view showing a step next to the one shown in FIG. 6 in the method of manufacturing a photovoltaic device in accordance with Embodiment 1.

As shown in FIG. 9, the liquid-repelling layer 16 and the first amorphous semiconductor layer 13 are partially removed using the etching paste 21. In the manufacture of the photovoltaic device 1 including the first i-type amorphous semiconductor layer 12, the liquid-repelling layer 16, the first amorphous semiconductor layer 13, and the first i-type amorphous semiconductor layer 12 are partially removed using the etching paste 21. More specifically, the semiconductor substrate 11 onto which the etching paste 21 has been applied may be subjected to a heat treatment to etch out those parts of the liquid-repelling layer 16, the first amorphous semiconductor layer 13, and the first i-type amorphous semiconductor layer 12 on the second face 11b of the semiconductor substrate 11 onto which the etching paste 21 has been applied.

The heating temperature in the heat treatment is preferably from 200° C. to 400° C. inclusive. If the heating temperature in the heat treatment is below 200° C., the liquid-repelling layer 16, the first amorphous semiconductor layer 13, and the first i-type amorphous semiconductor layer 12 may only insufficiently be etched and left unremoved. If the heating temperature in the heat treatment is above 400° C., the etching paste 21 may burn and stick to the second face 11b of the semiconductor substrate 11, which could make it difficult to completely remove the etching paste 21 from the second face 11b of the semiconductor substrate 11 in a step subsequent to the heat treatment.

The method of manufacturing the photovoltaic device 1 in accordance with the present embodiment uses phosphoric acid as the component of the etching paste 21 for etching the liquid-repelling layer 16, the first amorphous semiconductor layer 13, and the first i-type amorphous semiconductor layer 12. Phosphoric acid is difficult to evaporate at normal temperature and even at the heating temperature in the heat treatment. The use of phosphoric acid can therefore restrain those parts of the liquid-repelling layer 16, the first amorphous semiconductor layer 13, and the first i-type amorphous semiconductor layer 12 to which no etching paste 21 has been applied from being etched out. By using the etching paste 21, the liquid-repelling layer 16, the first amorphous semiconductor layer 13, and the first i-type amorphous semiconductor layer 12 can be etched with approximately as high an aspect ratio as the layers 16, 13, and 12 are etched by photolithography. The first amorphous semiconductor layer 13 of the first conductivity type can therefore be precisely patterned. In addition, since the etching paste 21 can be applied to the liquid-repelling layer 16 by a method such as printing, the photovoltaic device 1 can be manufactured at a lower cost than if the layers 16, 13, and 12 are etched by photolithography.

The heat treatment may be done using any heating device including, for example, a hotplate, a belt furnace, or an oven. If phosphoric acid is used as a component of the etching paste 21 for etching the liquid-repelling layer 16, the first amorphous semiconductor layer 13, and the first i-type amorphous semiconductor layer 12, the heating device is less likely to be corroded by the etching paste 21 due to phosphoric acid being difficult to evaporate. Therefore, a belt furnace or an oven may be used as the heating device in the heat treatment. If the heat treatment is done in a belt furnace or an oven, temperature differences are less likely to develop between the periphery and the center of the semiconductor substrate 11. The heat treatment, if done in a belt furnace or an oven, is less likely to cause inconsistencies between the periphery and the center of the semiconductor substrate 11 in the etching of the liquid-repelling layer 16, the first amorphous semiconductor layer 13, and the first i-type amorphous semiconductor layer 12.

After the heat treatment, the second face 11b of the semiconductor substrate 11 is washed to remove the etching paste 21. Openings are formed in this manner through parts of the liquid-repelling layer 16, the first amorphous semiconductor layer 13, and the first i-type amorphous semiconductor layer 12 as shown in FIG. 9. Parts of the second face 11b of the semiconductor substrate 11 are exposed in these openings.

Figure 10:
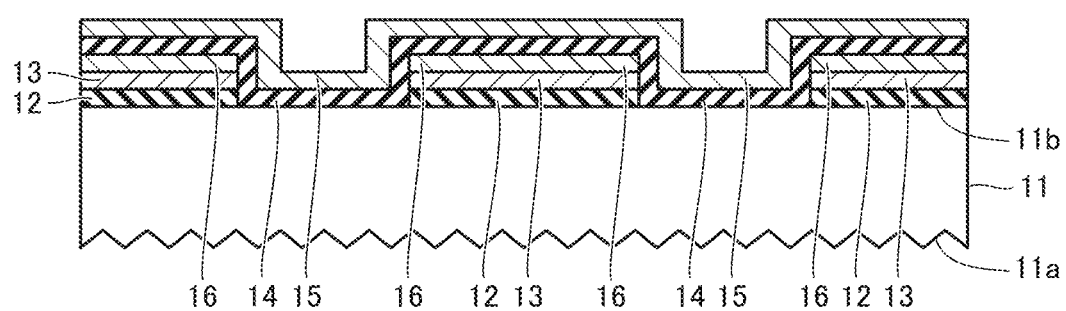
FIG. 10 is a schematic cross-sectional view showing a step next to the one shown in FIG. 9 in the method of manufacturing a photovoltaic device in accordance with Embodiment 1.

As shown in FIG. 10, a second amorphous semiconductor layer 15 of the second conductivity type, which differs from the first conductivity type, is formed above the first amorphous semiconductor layer 13 and on those parts of the second face 11b of the semiconductor substrate 11 from which the first amorphous semiconductor layer 13 has been removed. In the present embodiment, since the liquid-repelling layer 16 is formed on the first amorphous semiconductor layer 13, the second amorphous semiconductor layer 15 of the second conductivity type, which differs from the first conductivity type, is formed on the liquid-repelling layer 16 and on those parts of the second face 11b of the semiconductor substrate 11 from which the liquid-repelling layer 16 has been removed. To manufacture the photovoltaic device 1 including a second i-type amorphous semiconductor layer 14 between the semiconductor substrate 11 and the second amorphous semiconductor layer 15, the second i-type amorphous semiconductor layer 14 may be formed, prior to the formation of the second amorphous semiconductor layer 15, on the liquid-repelling layer 16 and on the second face 11b of the semiconductor substrate 11 from which the liquid-repelling layer 16 has been removed. The second i-type amorphous semiconductor layer 14 and the second amorphous semiconductor layer 15 of the second conductivity type may be formed by any method including, for example, plasma chemical vapor deposition (CVD).

Figure 11:
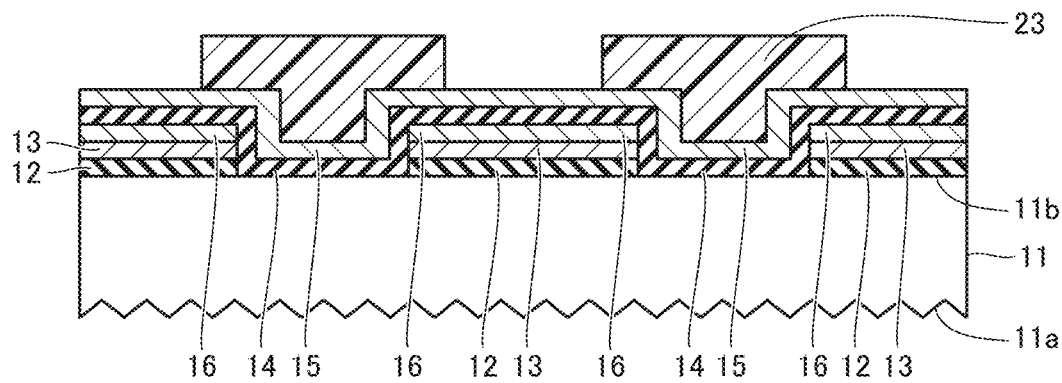
FIG. 11 is a schematic cross-sectional view showing a step next to the one shown in FIG. 10 in the method of manufacturing a photovoltaic device in accordance with Embodiment 1.
Figure 12:
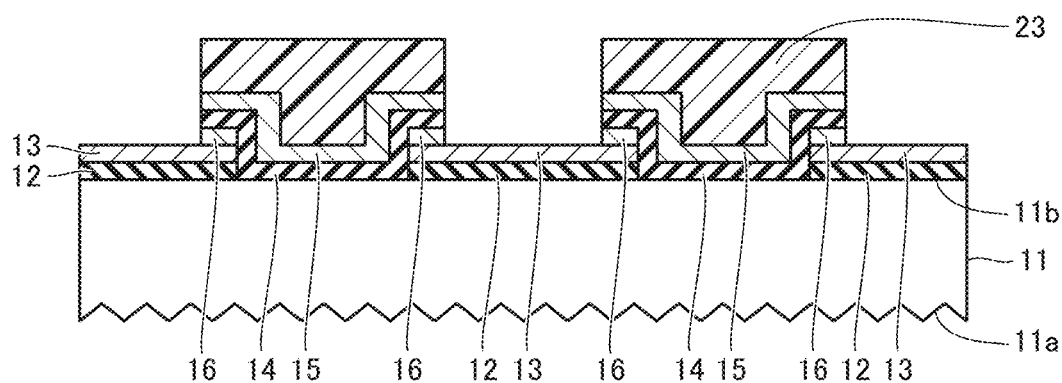
FIG. 12 is a schematic cross-sectional view showing a step next to the one shown in FIG. 11 in the method of manufacturing a photovoltaic device in accordance with Embodiment 1.
Figure 13:
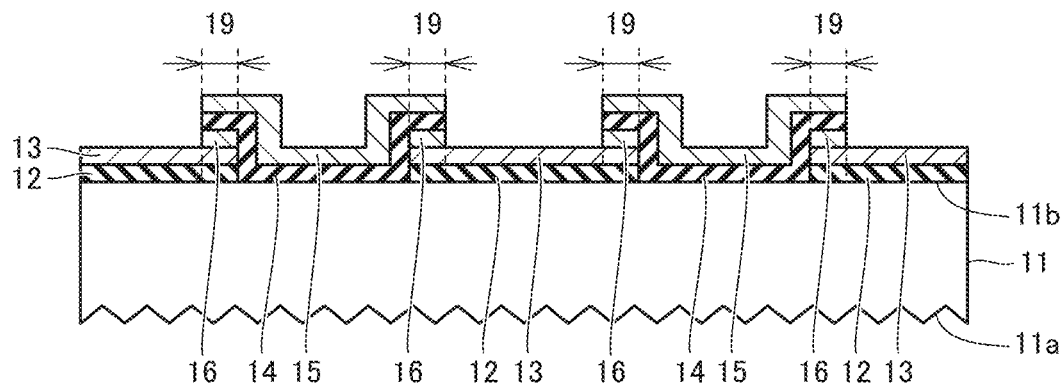
FIG. 13 is a schematic cross-sectional view showing a step next to the one shown in FIG. 12 in the method of manufacturing a photovoltaic device in accordance with Embodiment 1.

As shown in FIGS. 11 to 13, the second amorphous semiconductor layer 15 is partially removed. In the method of manufacturing the photovoltaic device 1 in accordance with the present embodiment, the liquid-repelling layer 16 is partially removed when the second amorphous semiconductor layer 15 is partially removed. In the manufacture of the photovoltaic device 1 including the second i-type amorphous semiconductor layer 14, the liquid-repelling layer 16, the second amorphous semiconductor layer 15, and the second i-type amorphous semiconductor layer 14 are partially removed.

Specifically, as shown in FIG. 11, an etching mask 23 is provided on parts of the second amorphous semiconductor layer 15. The etching mask 23 is provided in and above the openings shown in FIG. 9 as well as over the edges of the first amorphous semiconductor layer 13. The etching mask 23 may be provided on parts of the second amorphous semiconductor layer 15 by a method such as photolithography or application of a masking paste.

As shown in FIG. 12, those parts of the liquid-repelling layer 16, the second amorphous semiconductor layer 15, and the second i-type amorphous semiconductor layer 14 which are not covered by the etching mask 23 are removed by a method such as dry etching or wet etching. As shown in FIG. 13, the etching mask 23 is removed to expose the surface of the second amorphous semiconductor layer 15. The second amorphous semiconductor layer 15 has edges thereof over the edges of the first amorphous semiconductor layer 13. The edges of the second amorphous semiconductor layer 15 are positioned above the edges of the first amorphous semiconductor layer 13. No liquid-repelling layer 16 is provided between the first amorphous semiconductor layer 13 and the second amorphous semiconductor layer 15, except between the edges of the first amorphous semiconductor layer 13 and the edges of the second amorphous semiconductor layer 15.

The first electrodes 17 are then provided in electric connection with the first amorphous semiconductor layer 13 on the second face 11b of the semiconductor substrate 11. Specifically, the first electrodes 17 are provided on the first amorphous semiconductor layer 13. The second electrodes 18 are provided in electric connection with the second amorphous semiconductor layer 15 on the second face 11b of the semiconductor substrate 11. Specifically, the second electrodes 18 are provided on the second amorphous semiconductor layer 15. Either the first electrodes 17 or the second electrodes 18 may first be provided in electric connection with the first amorphous semiconductor layer 13 or in electric connection with the second amorphous semiconductor layer 15 respectively on the second face 11b of the semiconductor substrate 11 before the others. Alternatively, the first electrodes 17 and the second electrodes 18 may be provided on the second face 11b of the semiconductor substrate 11 at the same time. That can conclude the manufacture of the photovoltaic device 1 of the present embodiment shown in FIG. 1.

As a variation example of the method of manufacturing the photovoltaic device 1 in accordance with the present embodiment, the liquid-repelling layer 16 on the first amorphous semiconductor layer 13 may be entirely removed between the step shown in FIG. 9 and the step shown in FIG.

10. The photovoltaic device 1, if manufactured by this variation manufacturing method example, includes no liquid-repelling layer 16.

The photovoltaic device 1 and the method of manufacturing the photovoltaic device 1 in accordance with the present embodiment have effects as detailed below. The photovoltaic device 1 of the present embodiment includes: the semiconductor substrate 11 having the first face 11a and the second face 11b opposite the first face 11a; the first amorphous semiconductor layer 13 of the first conductivity type provided on the second face 11b; and the second amorphous semiconductor layer 15 of the second conductivity type, which differs from the first conductivity type, provided on the second face 11b. The edges of the second amorphous semiconductor layer 15 are positioned above the edges of the first amorphous semiconductor layer 13. The photovoltaic device 1 of the present embodiment further includes the liquid-repelling layer 16 between the edges of the first amorphous semiconductor layer 13 and the edges of the second amorphous semiconductor layer 15. No liquid-repelling layer 16 is provided between the first amorphous semiconductor layer 13 and the second amorphous semiconductor layer 15, except between the edges of the first amorphous semiconductor layer 13 and the edges of the second amorphous semiconductor layer 15. The photovoltaic device 1 of the present embodiment further includes: the first electrodes 17 provided in electric connection with the first amorphous semiconductor layer 13 on the second face 11b; and the second electrodes 18 provided in electric connection with the second amorphous semiconductor layer 15 on the second face 11b.

Since the liquid-repelling layer 16 is disposed on the first amorphous semiconductor layer 13, the first amorphous semiconductor layer 13 of the first conductivity type can be patterned using a flowable patterning agent such as the etching paste 21 applied to the liquid-repelling layer 16. Additionally, the etching paste 21 or like flowable patterning agent spreads less on the liquid-repelling layer 16 than on the first amorphous semiconductor layer 13 of the first conductivity type. The liquid-repelling layer 16 can therefore restrain the etching paste 21 or like flowable patterning agent from spreading thereon beyond a designed range. This structure can therefore achieve precise patterning of the first amorphous semiconductor layer 13 of the first conductivity type in the photovoltaic device 1 of the present embodiment.

In the photovoltaic device 1 of the present embodiment, the first conductivity type may be the p-type, and the liquid-repelling layer 16 may be an n-type semiconductor layer. Since the liquid-repelling layer 16, which is an n-type semiconductor layer, is disposed on the first amorphous semiconductor layer 13, the first amorphous semiconductor layer 13 of the first conductivity type can be patterned using a flowable patterning agent such as the etching paste 21 applied to the liquid-repelling layer 16. Additionally, the etching paste 21 or like flowable patterning agent spreads less on the liquid-repelling layer 16, which is an n-type semiconductor layer, than on the first amorphous semiconductor layer 13 of the first conductivity type. The liquid-repelling layer 16 can therefore restrain the etching paste 21 or like flowable patterning agent from spreading thereon beyond a designed range. This structure can therefore achieve precise patterning of the p-type, first amorphous semiconductor layer 13 in the photovoltaic device 1 of the present embodiment.

The photovoltaic device 1 of the present embodiment includes: the semiconductor substrate 11 having the first face 11a and the second face 11b opposite the first face 11a; the p-type, first amorphous semiconductor layer 13 provided on the second face 11b; and the n-type, second amorphous semiconductor layer 15 provided on the second face 11b. The edges of the second amorphous semiconductor layer 15 are positioned above the edges of the first amorphous semiconductor layer 13. The photovoltaic device 1 of the present embodiment further includes an n-type semiconductor layer (16) between the edges of the first amorphous semiconductor layer 13 and the edges of the second amorphous semiconductor layer 15. No such an n-type semiconductor layer (16) is provided between the first amorphous semiconductor layer 13 and the second amorphous semiconductor layer 15, except between the edges of the first amorphous semiconductor layer 13 and the edges of the second amorphous semiconductor layer 15. The photovoltaic device 1 of the present embodiment further includes: the first electrodes 17 provided in electric connection with the first amorphous semiconductor layer 13 on the second face 11b; and the second electrodes 18 provided in electric connection with the second amorphous semiconductor layer 15 on the second face 11b.

Since the n-type semiconductor layer (16) is disposed on the first amorphous semiconductor layer 13, the p-type, first amorphous semiconductor layer 13 can be patterned using a flowable patterning agent such as the etching paste 21 applied to the n-type semiconductor layer (16). Additionally, the etching paste 21 or like flowable patterning agent spreads less on the n-type semiconductor layer (16) than on the p-type, first amorphous semiconductor layer 13. The n-type semiconductor layer (16) can therefore restrain the etching paste 21 or like flowable patterning agent from spreading thereon beyond a designed range. This structure can therefore achieve precise patterning of the p-type, first amorphous semiconductor layer 13 in the photovoltaic device 1 of the present embodiment.

The photovoltaic device 1 of the present embodiment may further include the first i-type amorphous semiconductor layer 12 between the semiconductor substrate 11 and the first amorphous semiconductor layer 13. The first i-type amorphous semiconductor layer 12 can reduce recombination, on the second face 11b of the semiconductor substrate 11, of the carriers generated in the semiconductor substrate 11 by the light entering the semiconductor substrate 11 through the first face 11a. This structure of the photovoltaic device 1 of the present embodiment can therefore improve efficiency of conversion of light energy to electric energy.

The photovoltaic device 1 of the present embodiment may further include the second i-type amorphous semiconductor layer 14 between the semiconductor substrate 11 and the second amorphous semiconductor layer 15. The second i-type amorphous semiconductor layer 14 can reduce recombination, on the second face 11b of the semiconductor substrate 11, of the carriers generated in the semiconductor substrate 11 by the light entering the semiconductor substrate 11 through the first face 11a. This structure of the photovoltaic device 1 of the present embodiment can therefore improve efficiency of conversion of light energy to electric energy. In addition, the first amorphous semiconductor layer 13 and the second amorphous semiconductor layer 15 are isolated from each other by the second i-type amorphous semiconductor layer 14. In other words, the first amorphous semiconductor layer 13 is not in contact with the second amorphous semiconductor layer 15. This structure of the photovoltaic device 1 of the present embodiment can therefore improve efficiency of conversion of light energy to electric energy.

The photovoltaic device 1 of the present embodiment may include an irregular structure on the first face 11a of the semiconductor substrate 11 to reduce optical reflectance on the first face 11a. The provision of the irregular structure on the first face 11a, which is a light-incident face, of the semiconductor substrate 11 can enable admission of more light into the photovoltaic device 1. This structure of the photovoltaic device 1 of the present embodiment can therefore improve efficiency of conversion of light energy to electric energy.

The method of manufacturing the photovoltaic device 1 in accordance with the present embodiment includes: preparing the semiconductor substrate 11 having the first face 11a and the second face 11b opposite the first face 11a; and forming the first amorphous semiconductor layer 13 of the first conductivity type on the second face 11b of the semiconductor substrate 11. The method of manufacturing the photovoltaic device 1 in accordance with the present embodiment further includes: forming the liquid-repelling layer 16 on the first amorphous semiconductor layer 13; applying the etching paste 21 on the liquid-repelling layer 16; and removing parts of the liquid-repelling layer 16 and the first amorphous semiconductor layer 13 using the etching paste 21. The method of manufacturing the photovoltaic device 1 in accordance with the present embodiment further includes: forming the second amorphous semiconductor layer 15 of the second conductivity type, which differs from the first conductivity type, above the first amorphous semiconductor layer 13 and on those parts of the second face 11b of the semiconductor substrate 11 from which the first amorphous semiconductor layer 13 has been removed; removing parts of the second amorphous semiconductor layer 15; and removing parts of the liquid-repelling layer 16. The method of manufacturing the photovoltaic device 1 in accordance with the present embodiment further includes: providing the first electrodes 17 on the second face 11b such that the first electrodes 17 are electrically connected to the first amorphous semiconductor layer 13; and providing the second electrodes 18 on the second face 11b such that the second electrodes 18 are electrically connected to the second amorphous semiconductor layer 15.

The method of manufacturing the photovoltaic device 1 in accordance with the present embodiment provides the etching paste 21 on the liquid-repelling layer 16. The liquid-repelling layer 16 allows the etching paste 21 to spread less thereon than does the first amorphous semiconductor layer 13. In other words, the contact angle between the surface of the liquid-repelling layer 16 and the etching paste 21 is greater than the contact angle between the surface of the first amorphous semiconductor layer 13 and the etching paste 21. As shown in FIG. 7(A), this structure, formed by the method of manufacturing the photovoltaic device 1 in accordance with the present embodiment, can therefore make the etching paste 21 less likely to spread on the liquid-repelling layer 16 beyond a designed range, thereby achieving precise patterning of the first amorphous semiconductor layer 13 of the first conductivity type.

In contrast, the method of manufacturing a photovoltaic device in accordance with a comparative example provides the etching paste 21 directly on the first amorphous semiconductor layer 13 of the first conductivity type. As shown in FIG. 7(B), the etching paste 21 spreads (showing relatively high wettability) on the first amorphous semiconductor layer 13 of the first conductivity type beyond a designed range. It is therefore difficult to perform precise patterning of the first amorphous semiconductor layer 13 of the first conductivity type by the method of manufacturing a photovoltaic device in accordance with the comparative example.

In the method of manufacturing the photovoltaic device 1 in accordance with the present embodiment, the first conductivity type may be the p-type, and the liquid-repelling layer 16 may be an n-type semiconductor layer. The liquid-repelling layer 16, which is an n-type semiconductor layer, allows the etching paste 21 to spread less thereon than does the p-type, first amorphous semiconductor layer 13. In other words, the contact angle between the surface of the liquid-repelling layer 16, which is an n-type semiconductor layer, and the etching paste 21 is greater than the contact angle between the surface of the p-type, first amorphous semiconductor layer 13 and the etching paste 21. As shown in FIG. 7(A), this structure, formed by the method of manufacturing the photovoltaic device 1 in accordance with the present embodiment, can therefore make the etching paste 21 less likely to spread on the liquid-repelling layer 16 beyond a designed range, thereby achieving precise patterning of the p-type, first amorphous semiconductor layer 13.

In contrast, the method of manufacturing a photovoltaic device in accordance with the comparative example provides the etching paste 21 directly on the p-type, first amorphous semiconductor layer 13. As shown in FIG. 7(B), the etching paste 21 spreads (showing relatively high wettability) on the p-type, first amorphous semiconductor layer 13 beyond a designed range. It is therefore difficult to perform precise patterning of the p-type, first amorphous semiconductor layer 13 by the method of manufacturing a photovoltaic device in accordance with the comparative example.

In the method of manufacturing the photovoltaic device 1 in accordance with the present embodiment, the contact angle between the surface of the liquid-repelling layer 16 and the etching paste 21 may be from 45° to 135° inclusive. The contact angle between the surface of the liquid-repelling layer 16 and the etching paste 21, being greater than or equal to 45°, can restrain the etching paste 21 from spreading on the liquid-repelling layer 16 beyond a designed range. The contact angle between the surface of the liquid-repelling layer 16 and the etching paste 21, being less than or equal to 135°, can restrain the etching paste 21 applied to the surface of the liquid-repelling layer 16 from holding back and thereby excessively reducing the parts of the first amorphous semiconductor layer 13 that are removed by the etching paste 21. This arrangement of the method of manufacturing the photovoltaic device 1 in accordance with the present embodiment can therefore achieve precise patterning of the first amorphous semiconductor layer 13 of the first conductivity type.

In the method of manufacturing the photovoltaic device 1 in accordance with the present embodiment, the etching paste 21 may contain phosphoric acid. Phosphoric acid is difficult to evaporate at normal temperature and even at the heating temperature in the heat treatment. The use of phosphoric acid can therefore restrain those parts of the liquid-repelling layer 16 and the first amorphous semiconductor layer 13 to which no etching paste 21 has been applied from being etched out. The use of the etching paste 21 containing phosphoric acid in the method of manufacturing the photovoltaic device 1 in accordance with the present embodiment can enable etching of the liquid-repelling layer 16 and the first amorphous semiconductor layer 13 with a high aspect ratio, thereby achieving precise patterning of the first amorphous semiconductor layer 13 of the first conductivity type. In addition, if a heating device is used to etch the liquid-repelling layer 16 and the first amorphous semiconductor layer 13, the heating device is less likely to be corroded by the etching paste 21 containing phosphoric acid due to phosphoric acid being difficult to evaporate.

The method of manufacturing the photovoltaic device 1 in accordance with the present embodiment may further include forming the first i-type amorphous semiconductor layer 12 between the semiconductor substrate 11 and the first amorphous semiconductor layer 13. The first i-type amorphous semiconductor layer 12 can restrict the carriers generated in the semiconductor substrate 11 by the light entering the semiconductor substrate 11 through the first face 11a from recombining on the second face 11b of the semiconductor substrate 11. This structure, formed by the method of manufacturing the photovoltaic device 1 in accordance with the present embodiment, can therefore confer improved efficiency of conversion of light energy to electric energy to the resultant photovoltaic device.

The method of manufacturing the photovoltaic device 1 in accordance with the present embodiment may further include forming the second i-type amorphous semiconductor layer 14 between the semiconductor substrate 11 and the second amorphous semiconductor layer 15. The second i-type amorphous semiconductor layer 14 can restrict the carriers generated in the semiconductor substrate 11 by the light entering the semiconductor substrate 11 through the first face 11a from recombining on the second face 11b of the semiconductor substrate 11. This structure, formed by the method of manufacturing the photovoltaic device 1 in accordance with the present embodiment, can therefore confer improved efficiency of conversion of light energy to electric energy to the resultant photovoltaic device. In addition, the first amorphous semiconductor layer 13 and the second amorphous semiconductor layer 15 are isolated from each other by the second i-type amorphous semiconductor layer 14. In other words, the first amorphous semiconductor layer 13 is not in contact with the second amorphous semiconductor layer 15. This structure, formed by the method of manufacturing the photovoltaic device 1 in accordance with the present embodiment, can therefore improve efficiency of conversion of light energy to electric energy in the resultant photovoltaic device.

The method of manufacturing the photovoltaic device 1 in accordance with the present embodiment may further include forming an irregular structure on the first face 11a of the semiconductor substrate 11 to reduce optical reflectance on the first face 11a. The provision of the irregular structure on the first face 11a, which is a light-incident face, of the semiconductor substrate 11 can enable admission of more light into the photovoltaic device 1. This structure, formed by the method of manufacturing the photovoltaic device 1 in accordance with the present embodiment, can therefore improve efficiency of conversion of light energy to electric energy in the resultant photovoltaic device.

Embodiment 2

A photovoltaic device 1a and a method of manufacturing the photovoltaic device 1a in accordance with Embodiment 2 will be described in reference to FIGS. 2 to 4 and 14 to 22. The photovoltaic device 1a of the present embodiment shown in FIG. 14 has basically the same configuration as the photovoltaic device 1 of Embodiment 1 shown in FIG. 1, but differs as detailed below. Additionally, a method of manufacturing the photovoltaic device 1a in accordance with the present embodiment shown in FIGS. 2 to 4 and 15 to 22 includes basically the same steps as the method of manufacturing the photovoltaic device 1 in accordance with Embodiment 1 shown in FIGS. 2 to 13, but differs as detailed below.

Figure 14:
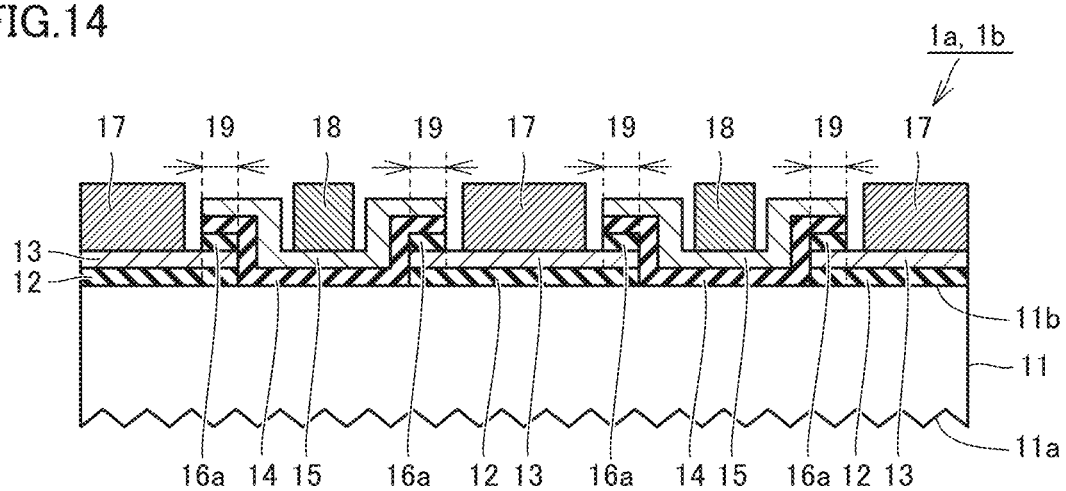
FIG. 14 is a schematic cross-sectional view of a photovoltaic device in accordance with Embodiments 2 and 3.

In Embodiment 1, the liquid-repelling layer 16 is an n-type semiconductor layer such as an n-type silicon layer. In contrast, as shown in FIG. 14, the photovoltaic device 1a of the present embodiment includes an i-type semiconductor layer such as an i-type silicon layer as a liquid-repelling layer 16a. The liquid-repelling layer 16a, which is an i-type semiconductor layer, is made of a material on which the etching paste 21 spreads less than on the first amorphous semiconductor layer 13 of the first conductivity type. The liquid-repelling layer 16a is made of such a material that the contact angle between the surface of the liquid-repelling layer 16a and the etching paste 21 is greater than the contact angle between the surface of the first amorphous semiconductor layer 13 and the etching paste 21.

Referring to FIGS. 2 to 4 and 15 to 22, the following will describe an exemplary method of manufacturing the photovoltaic device 1a in accordance with the present embodiment.

The steps shown in FIGS. 2 to 4 form an irregular structure on the first face 11a of the semiconductor substrate 11 and form the first amorphous semiconductor layer 13 of the first conductivity type on the second face 11b of the semiconductor substrate 11. To manufacture the photovoltaic device 1a including a first i-type amorphous semiconductor layer 12 between the semiconductor substrate 11 and the first amorphous semiconductor layer 13, the first i-type amorphous semiconductor layer 12 may be formed on the second face 11b of the semiconductor substrate 11 prior to the formation of the first amorphous semiconductor layer 13, and the first amorphous semiconductor layer 13 may then be formed on the first i-type amorphous semiconductor layer 12.

Figure 15:
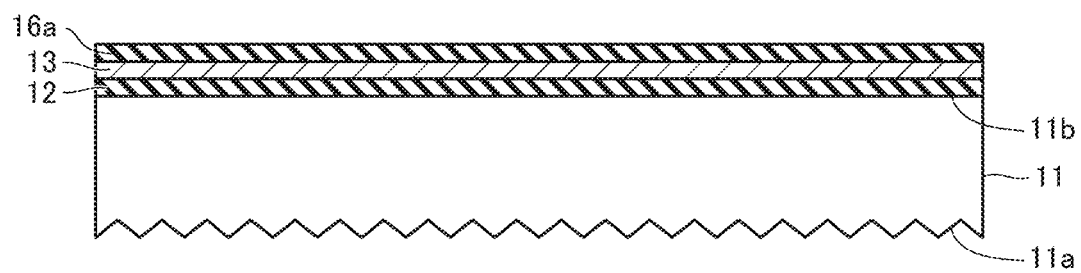
FIG. 15 is a schematic cross-sectional view showing a step next to the one shown in FIG. 4 in the method of manufacturing a photovoltaic device in accordance with Embodiments 2 and 3.

As shown in FIG. 15, the liquid-repelling layer 16a is formed on the first amorphous semiconductor layer 13. The liquid-repelling layer 16a is made of a material on which the etching paste 21 spreads less than on the first amorphous semiconductor layer 13. The liquid-repelling layer 16a is made of such a material that the contact angle between the surface of the liquid-repelling layer 16a and the etching paste 21 is greater than the contact angle between the surface of the first amorphous semiconductor layer 13 and the etching paste 21. The liquid-repelling layer 16a may therefore be an i-type semiconductor layer such as an i-type silicon layer. The liquid-repelling layer 16a may be formed by plasma chemical vapor deposition (CVD) or any other method.

Figure 16:
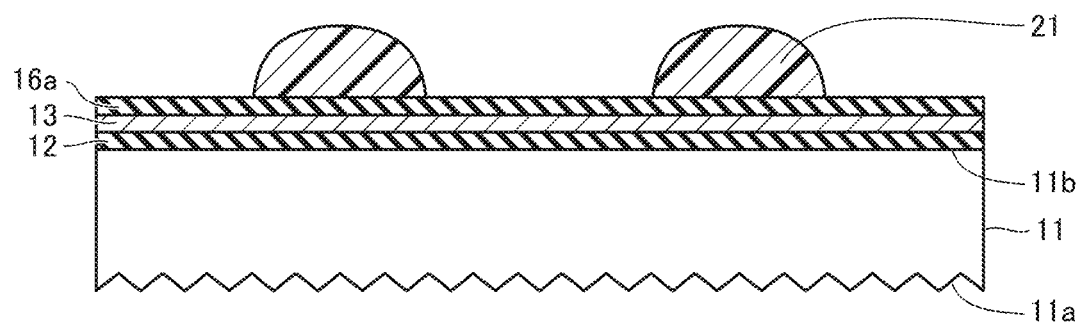
FIG. 16 is a schematic cross-sectional view showing a step next to the one shown in FIG. 15 in the method of manufacturing a photovoltaic device in accordance with Embodiments 2 and 3.
Figure 17:
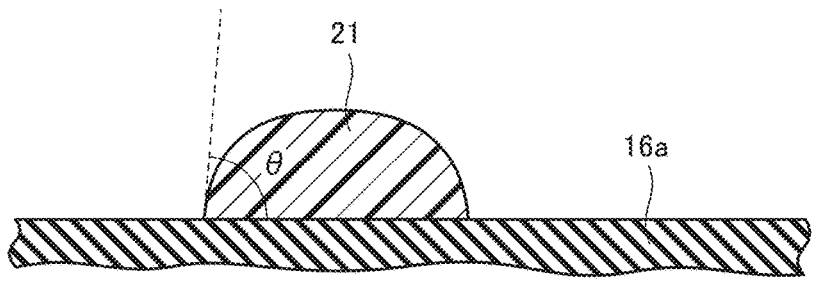
FIG. 17 is an enlarged schematic partial cross-sectional view showing the step shown in FIG. 16 in the method of manufacturing a photovoltaic device in accordance with Embodiments 2 and 3.

As shown in FIG. 16, the etching paste 21 is applied to parts of the liquid-repelling layer 16a. The etching paste 21 contains a component capable of etching the liquid-repelling layer 16a and the first amorphous semiconductor layer 13. In the manufacture of the photovoltaic device 1a including the first i-type amorphous semiconductor layer 12, the etching paste 21 contains a component capable of etching the liquid-repelling layer 16a, the first amorphous semiconductor layer 13, and the first i-type amorphous semiconductor layer 12. The etching paste 21 may be applied to the liquid-repelling layer 16a, for example, by screen printing. The etching paste 21, applied to the liquid-repelling layer 16a in the method of manufacturing the photovoltaic device 1a in accordance with the present embodiment, is less likely to spread on the liquid-repelling layer 16a beyond a designed range, thereby achieving precise patterning of the first amorphous semiconductor layer 13 of the first conductivity type. As shown in FIG. 17, the contact angle, θ, between the surface of the liquid-repelling layer 16a and the etching paste 21 may be from 45° to 135° inclusive.

An exemplary component of the etching paste 21 capable of etching the liquid-repelling layer 16a, the first amorphous semiconductor layer 13, and the first i-type amorphous semiconductor layer 12 is phosphoric acid. The etching paste 21 of the present embodiment may be the same as the etching paste 21 of Embodiment 1.

Figure 18:
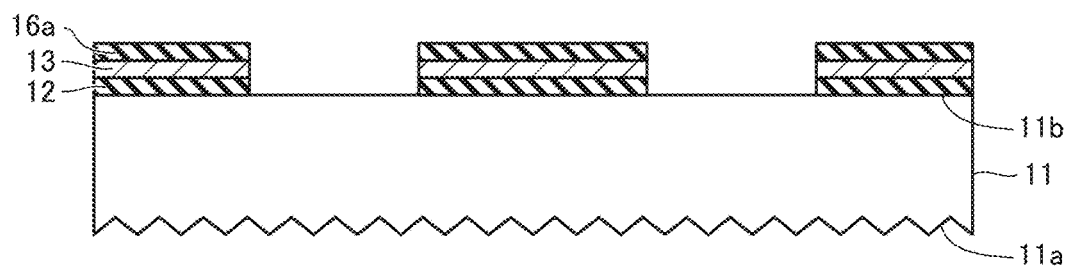
FIG. 18 is a schematic cross-sectional view showing a step next to the one shown in FIG. 16 in the method of manufacturing a photovoltaic device in accordance with Embodiments 2 and 3.

As shown in FIG. 18, the liquid-repelling layer 16a and the first amorphous semiconductor layer 13 are partially removed using the etching paste 21. In the manufacture of the photovoltaic device 1a including the first i-type amorphous semiconductor layer 12, the liquid-repelling layer 16a, the first amorphous semiconductor layer 13, and the first i-type amorphous semiconductor layer 12 are partially removed using the etching paste 21. The step shown in FIG. 18 may be the same as the step shown in FIG. 9.

Figure 19:
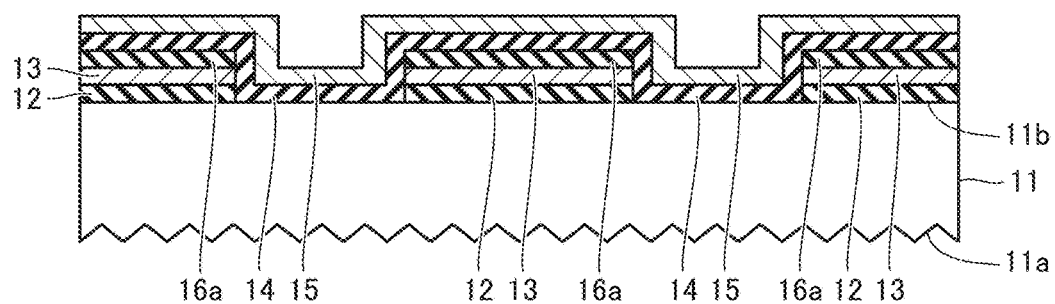
FIG. 19 is a schematic cross-sectional view showing a step next to the one shown in FIG. 18 in the method of manufacturing a photovoltaic device in accordance with Embodiments 2 and 3.

As shown in FIG. 19, a second amorphous semiconductor layer 15 of the second conductivity type, which differs from the first conductivity type, is formed above the first amorphous semiconductor layer 13 and on those parts of the second face 11b of the semiconductor substrate 11 from which the first amorphous semiconductor layer 13 has been removed. The step shown in FIG. 19 may be the same as the step shown in FIG. 10, except for the provision of the liquid-repelling layer 16.

Figure 20:
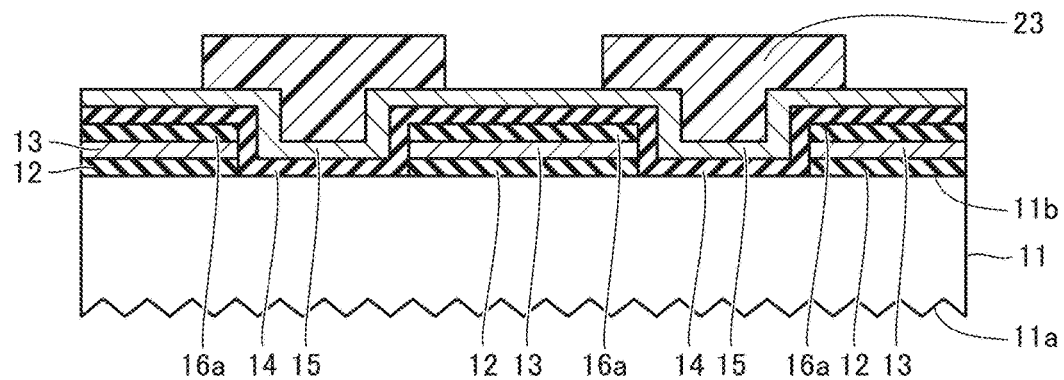
FIG. 20 is a schematic cross-sectional view showing a step next to the one shown in FIG. 19 in the method of manufacturing a photovoltaic device in accordance with Embodiments 2 and 3.
Figure 21:
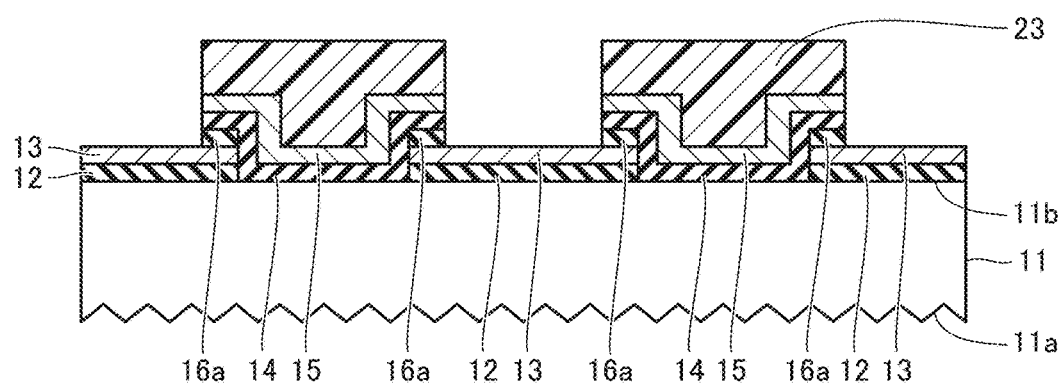
FIG. 21 is a schematic cross-sectional view showing a step next to the one shown in FIG. 20 in the method of manufacturing a photovoltaic device in accordance with Embodiments 2 and 3.
Figure 22:
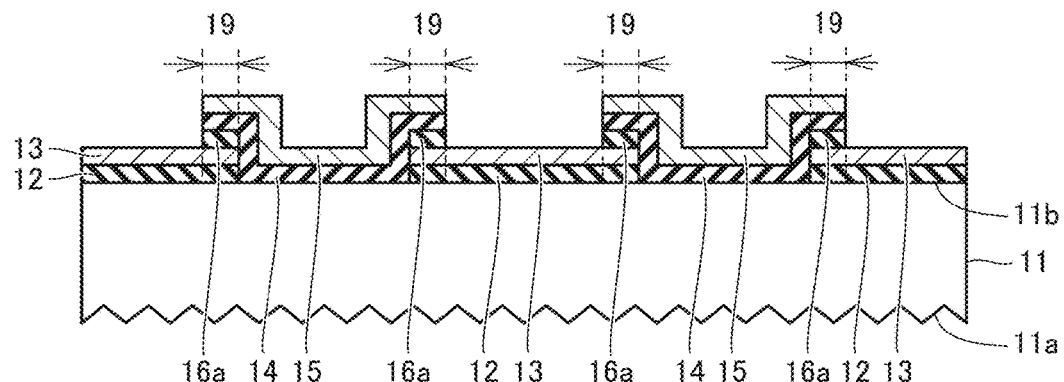
FIG. 22 is a schematic cross-sectional view showing a step next to the one shown in FIG. 21 in the method of manufacturing a photovoltaic device in accordance with Embodiments 2 and 3.

As shown in FIGS. 20 to 22, the second amorphous semiconductor layer 15 is partially removed. In the method of manufacturing the photovoltaic device 1a in accordance with the present embodiment, the liquid-repelling layer 16a is partially removed when the second amorphous semiconductor layer 15 is partially removed. To manufacture the photovoltaic device 1a including a second i-type amorphous semiconductor layer 14, the liquid-repelling layer 16a, the second amorphous semiconductor layer 15, and the second i-type amorphous semiconductor layer 14 are partially removed. The steps shown in FIGS. 20 to 22 may be the same as the steps shown in FIGS. 11 to 13 respectively.

The first electrodes 17 are then provided in electric connection with the first amorphous semiconductor layer 13 on the second face 11b of the semiconductor substrate 11. The second electrodes 18 are provided on the second amorphous semiconductor layer 15 on the second face 11b of the semiconductor substrate 11. That can conclude the manufacture of the photovoltaic device 1a of the present embodiment shown in FIG. 14.

As a variation example of the method of manufacturing the photovoltaic device 1a in accordance with the present embodiment, the liquid-repelling layer 16a on the first amorphous semiconductor layer 13 may be entirely removed between the step shown in FIG. 18 and the step shown in FIG. 19. The photovoltaic device 1a, if manufactured by this variation manufacturing method example, includes no liquid-repelling layer 16a.

The photovoltaic device 1a and the method of manufacturing the photovoltaic device 1a in accordance with the present embodiment have the same effects as the photovoltaic device 1 and the method of manufacturing the photovoltaic device 1 in accordance with Embodiment 1, except for the following points.

In the photovoltaic device 1a of the present embodiment, the liquid-repelling layer 16a may be an i-type semiconductor layer. The liquid-repelling layer 16a, which is an i-type semiconductor layer, is disposed on the first amorphous semiconductor layer 13. The first amorphous semiconductor layer 13 of the first conductivity type can therefore be patterned using a flowable patterning agent such as the etching paste 21 applied to the liquid-repelling layer 16a. Additionally, the etching paste 21 or like flowable patterning agent spreads less on the liquid-repelling layer 16a, which is an i-type semiconductor layer, than on the first amorphous semiconductor layer 13 of the first conductivity type. The liquid-repelling layer 16a can therefore restrain the etching paste 21 or like flowable patterning agent from spreading thereon beyond a designed range. This structure can therefore achieve precise patterning of the first amorphous semiconductor layer 13 of the first conductivity type in the photovoltaic device 1a of the present embodiment.

The photovoltaic device 1a of the present embodiment includes: the semiconductor substrate 11 having the first face 11a and the second face 11b opposite the first face 11a; the first amorphous semiconductor layer 13 of the first conductivity type provided on the second face 11b; and the second amorphous semiconductor layer 15 of the second conductivity type, which differs from the first conductivity type, provided on the second face 11b. The second amorphous semiconductor layer 15 has edges thereof over the edges of the first amorphous semiconductor layer 13. The photovoltaic device 1a of the present embodiment further includes an i-type semiconductor layer (16a) between the edges of the first amorphous semiconductor layer 13 and the edges of the second amorphous semiconductor layer 15. No such an i-type semiconductor layer (16a) is provided between the first amorphous semiconductor layer 13 and the second amorphous semiconductor layer 15, except between the edges of the first amorphous semiconductor layer 13 and the edges of the second amorphous semiconductor layer 15. The photovoltaic device 1a of the present embodiment further includes: the first electrodes 17 provided in electric connection with the first amorphous semiconductor layer 13 on the second face 11b; and the second electrodes 18 provided in electric connection with the second amorphous semiconductor layer 15 on the second face 11b.

Since the i-type semiconductor layer (16a) is disposed on the first amorphous semiconductor layer 13, the first amorphous semiconductor layer 13 of the first conductivity type can be patterned using a flowable patterning agent such as the etching paste 21 applied to the i-type semiconductor layer (16a). Additionally, the etching paste 21 or like flowable patterning agent spreads less on the i-type semiconductor layer (16a) than on the first amorphous semiconductor layer 13 of the first conductivity type. The i-type semiconductor layer (16a) can therefore restrain the etching paste 21 or like flowable patterning agent from spreading thereon beyond a designed range. This structure can therefore achieve precise patterning of the first amorphous semiconductor layer 13 of the first conductivity type in the photovoltaic device 1a of the present embodiment.

In the method of manufacturing the photovoltaic device 1a in accordance with the present embodiment, the liquid-repelling layer 16a may be an i-type semiconductor layer. The liquid-repelling layer 16a, which is an i-type semiconductor layer, allows the etching paste 21 to spread less thereon than does the first amorphous semiconductor layer 13 of the first conductivity type. In other words, the contact angle between the surface of the liquid-repelling layer 16a, which is an i-type semiconductor layer, and the etching paste 21 is greater than the contact angle between the surface of the first amorphous semiconductor layer 13 of the first conductivity type and the etching paste 21. This structure, formed by the method of manufacturing the photovoltaic device 1a in accordance with the present embodiment, can therefore make the etching paste 21 less likely to spread on the liquid-repelling layer 16a beyond a designed range, thereby achieving precise patterning of the first amorphous semiconductor layer 13 of the first conductivity type.

Embodiment 3

A photovoltaic device 1b and a method of manufacturing the photovoltaic device 1b in accordance with Embodiment 3 will be described in reference to FIGS. 2 to 4 and 14 to 22. The photovoltaic device 1b and the method of manufacturing the photovoltaic device 1b in accordance with the present embodiment are basically the same as the photovoltaic device 1a and the method of manufacturing the photovoltaic device 1a in accordance with Embodiment 2, but differ as detailed below.

In Embodiment 2, the liquid-repelling layer 16a is an i-type semiconductor layer such as an i-type silicon layer. In contrast, the photovoltaic device 1b of the present embodiment includes a silicon nitride layer as the liquid-repelling layer 16a. The liquid-repelling layer 16a, which is a silicon nitride layer, is made of a material on which the etching paste 21 spreads less than on the first amorphous semiconductor layer 13 of the first conductivity type. The liquid-repelling layer 16a is made of such a material that the contact angle between the surface of the liquid-repelling layer 16a and the etching paste 21 is greater than the contact angle between the surface of the first amorphous semiconductor layer 13 and the etching paste 21.

The photovoltaic device 1b and the method of manufacturing the photovoltaic device 1b in accordance with the present embodiment have the same effects as the photovoltaic device 1a and the method of manufacturing the photovoltaic device 1a in accordance with Embodiment 2, except for the following points.

In the photovoltaic device 1b of the present embodiment, the liquid-repelling layer 16a may be a silicon nitride layer. The liquid-repelling layer 16a, which is a silicon nitride layer, is disposed on the first amorphous semiconductor layer 13. The first amorphous semiconductor layer 13 of the first conductivity type can therefore be patterned using a flowable patterning agent such as the etching paste 21 applied to the liquid-repelling layer 16a. Additionally, the etching paste 21 or like flowable patterning agent spreads less on the liquid-repelling layer 16a, which is a silicon nitride layer, than on the first amorphous semiconductor layer 13 of the first conductivity type. The liquid-repelling layer 16a can therefore restrain the etching paste 21 or like flowable patterning agent from spreading thereon beyond a designed range. This structure can therefore achieve precise patterning of the first amorphous semiconductor layer 13 of the first conductivity type in the photovoltaic device 1b of the present embodiment.

The photovoltaic device 1b of the present embodiment includes: the semiconductor substrate 11 having the first face 11a and the second face 11b opposite the first face 11a; the first amorphous semiconductor layer 13 of the first conductivity type provided on the second face 11b; and the second amorphous semiconductor layer 15 of the second conductivity type, which differs from the first conductivity type, provided on the second face 11b. The second amorphous semiconductor layer 15 has edges thereof over the edges of the first amorphous semiconductor layer 13. The photovoltaic device 1b of the present embodiment further includes a silicon nitride layer (16a) between the edges of the first amorphous semiconductor layer 13 and the edges of the second amorphous semiconductor layer 15. No such a silicon nitride layer (16a) is provided between the first amorphous semiconductor layer 13 and the second amorphous semiconductor layer 15, except between the edges of the first amorphous semiconductor layer 13 and the edges of the second amorphous semiconductor layer 15. The photovoltaic device 1b of the present embodiment further includes: the first electrodes 17 provided in electric connection with the first amorphous semiconductor layer 13 on the second face 11b; and the second electrodes 18 provided in electric connection with the second amorphous semiconductor layer 15 on the second face 11b.

Since the silicon nitride layer (16a) is disposed on the first amorphous semiconductor layer 13, the first amorphous semiconductor layer 13 of the first conductivity type can be patterned using a flowable patterning agent such as the etching paste 21 applied to the silicon nitride layer (16a). Additionally, the etching paste 21 or like flowable patterning agent spreads less on the silicon nitride layer (16a) than on the first amorphous semiconductor layer 13 of the first conductivity type. The silicon nitride layer (16a) can therefore restrain the etching paste 21 or like flowable patterning agent from spreading thereon beyond a designed range. This structure can therefore achieve precise patterning of the first amorphous semiconductor layer 13 of the first conductivity type in the photovoltaic device 1b of the present embodiment.

In the method of manufacturing the photovoltaic device 1b in accordance with the present embodiment, the liquid-repelling layer 16a may be a silicon nitride layer. The liquid-repelling layer 16a, which is a silicon nitride layer, allows the etching paste 21 to spread less thereon than does the first amorphous semiconductor layer 13 of the first conductivity type. In other words, the contact angle between the surface of the liquid-repelling layer 16a, which is a silicon nitride layer, and the etching paste 21 is greater than the contact angle between the surface of the first amorphous semiconductor layer 13 of the first conductivity type and the etching paste 21. This structure, formed by the method of manufacturing the photovoltaic device 1b in accordance with the present embodiment, can therefore make the etching paste 21 less likely to spread on the liquid-repelling layer 16a beyond a designed range, thereby achieving precise patterning of the first amorphous semiconductor layer 13 of the first conductivity type.

Embodiment 4

A method of manufacturing a photovoltaic device 1c in accordance with Embodiment 4 will be described in reference to FIGS. 2 to 4 and 23 to 32. The method of manufacturing the photovoltaic device 1c in accordance with the present embodiment includes basically the same steps as the method of manufacturing the photovoltaic device 1 in accordance with Embodiment 1 shown in FIGS. 2 to 13, but differs as detailed below.

In Embodiment 1, the liquid-repelling layer 16 is an n-type semiconductor layer. In contrast, in the method of manufacturing the photovoltaic device 1c in accordance with the present embodiment, a liquid-repelling layer 16b is formed on the first amorphous semiconductor layer 13 by subjecting the surface of the first amorphous semiconductor layer 13 to a liquid-repelling process.

Referring to FIGS. 2 to 4 and 23 to 32, the following will describe an exemplary method of manufacturing the photovoltaic device 1c in accordance with the present embodiment.

The steps shown in FIGS. 2 to 4 form an irregular structure on the first face 11a of the semiconductor substrate 11 and form the first amorphous semiconductor layer 13 of a first conductivity type on the second face 11b of the semiconductor substrate 11. To manufacture the photovoltaic device 1a including a first i-type amorphous semiconductor layer 12 between the semiconductor substrate 11 and the first amorphous semiconductor layer 13, the first i-type amorphous semiconductor layer 12 may be formed on the second face 11b of the semiconductor substrate 11 prior to the formation of the first amorphous semiconductor layer 13, and the first amorphous semiconductor layer 13 may then be formed on the first i-type amorphous semiconductor layer 12.

Figure 23:
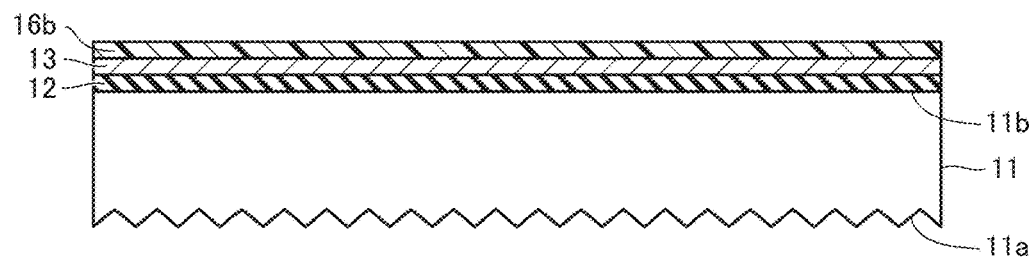
FIG. 23 is a schematic cross-sectional view showing a step next to the one shown in FIG. 4 in the method of manufacturing a photovoltaic device in accordance with Embodiment 4.

As shown in FIG. 23, the liquid-repelling layer 16b is formed on the first amorphous semiconductor layer 13. The liquid-repelling layer 16b allows the etching paste 21 to spread less thereon than does the first amorphous semiconductor layer 13. The contact angle between the surface of the liquid-repelling layer 16b and the etching paste 21 is greater than the contact angle between the surface of the first amorphous semiconductor layer 13 and the etching paste 21.

The forming of the liquid-repelling layer 16b on the first amorphous semiconductor layer 13 encompasses the subjecting of the surface of the first amorphous semiconductor layer 13 to a liquid-repelling process. If the solvent for the etching paste 21 is primarily water or a like hydrophilic medium, the surface of the first amorphous semiconductor layer 13 is subjected to a liquid-repelling process such that the surface of the first amorphous semiconductor layer 13 becomes hydrophobic. If the solvent for the etching paste 21 is primarily a hydrophobic medium, the surface of the first amorphous semiconductor layer 13 is subjected to a liquid-repelling process such that the surface of the first amorphous semiconductor layer 13 becomes hydrophilic.

As an example of the liquid-repelling process on the surface of the first amorphous semiconductor layer 13, the surface of the first amorphous semiconductor layer 13 may be subjected to a water-repelling process using a silylating agent. The silylating agent may contain hexamethyldisilazane (HMDS), trimethylsilyldiethylamine (TMSDEA), or trimethylsilyldimethylamine (TMSDMA).

Specifically, the semiconductor substrate 11 having the first amorphous semiconductor layer 13 thereon is first baked at a temperature of, for example, from 100° C. to 200° C. inclusive. This baking removes water molecules among others from the surface of the first amorphous semiconductor layer 13.

Next, the surface of the first amorphous semiconductor layer 13 is exposed to the silylating agent, for example, by applying the silylating agent in liquid form to the surface of the first amorphous semiconductor layer 13 or by exposing the surface of the first amorphous semiconductor layer 13 to the silylating agent in gaseous form. The exposure of the surface of the first amorphous semiconductor layer 13 to the silylating agent modifies the surface of the first amorphous semiconductor layer 13 with hydrophobic groups, thereby conferring hydrophobicity to the surface of the first amorphous semiconductor layer 13. Those parts of the surface of the first amorphous semiconductor layer 13 which are modified with hydrophobic groups act as the liquid-repelling layer 16b to the etching paste 21 of which the solvent is water.

Finally, the semiconductor substrate 11 having thereon the first amorphous semiconductor layer 13 exposed to the silylating agent is baked at a temperature of, for example, from 100° C. to 200° C. inclusive. This baking removes the unreacted silylating agent and byproducts.

Figure 24:
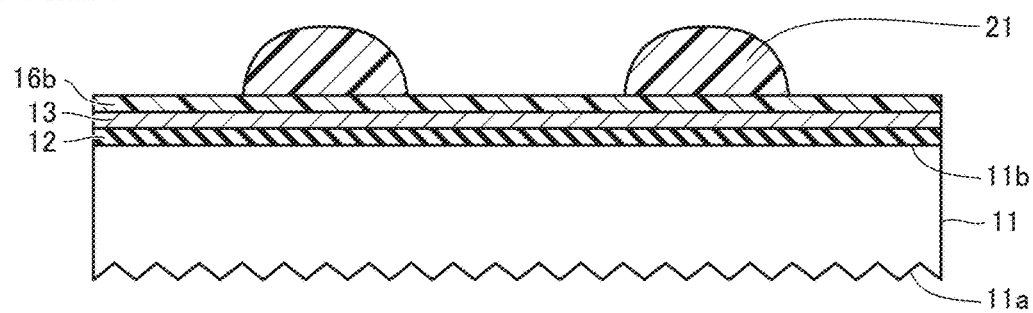
FIG. 24 is a schematic cross-sectional view showing a step next to the one shown in FIG. 23 in the method of manufacturing a photovoltaic device in accordance with Embodiment 4.

As shown in FIG. 24, the etching paste 21 is applied to parts of the liquid-repelling layer 16b. The etching paste 21 contains a component capable of etching the liquid-repelling layer 16b and the first amorphous semiconductor layer 13. In the manufacture of the photovoltaic device 1c including the first i-type amorphous semiconductor layer 12, the etching paste 21 contains a component capable of etching the liquid-repelling layer 16b, the first amorphous semiconductor layer 13, and the first i-type amorphous semiconductor layer 12. The etching paste 21 may be applied to the liquid-repelling layer 16b, for example, by screen printing.

Figure 25:
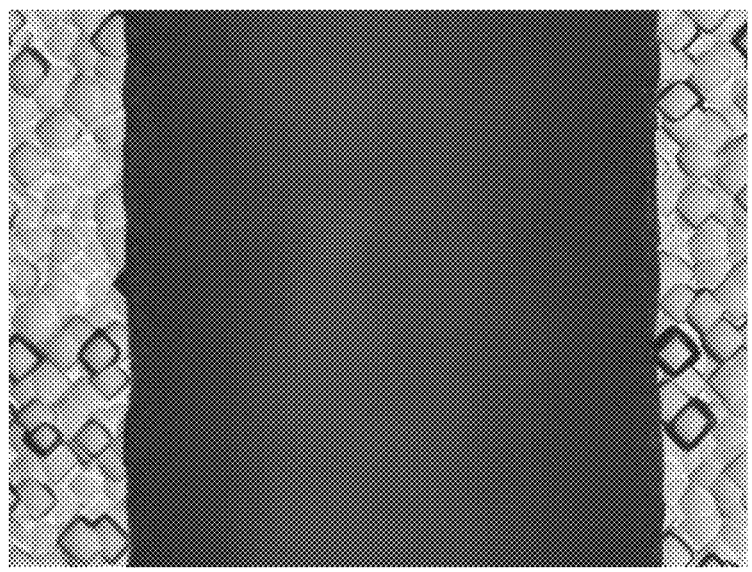
FIG. 25 is a drawing showing an enlarged partial photograph of a region to which an etching paste has been applied in the method of manufacturing a photovoltaic device in accordance with Embodiment 4.
Figure 26:
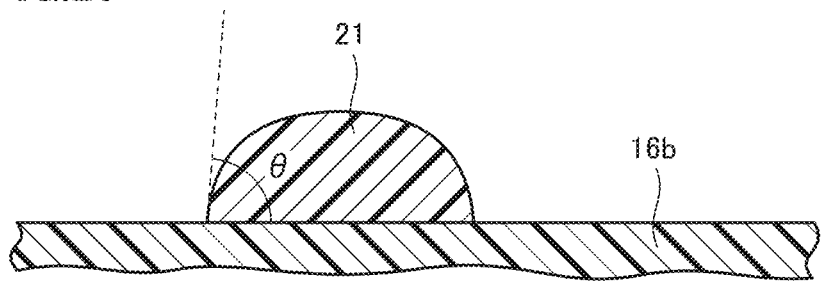
FIG. 26 is an enlarged schematic partial cross-sectional view showing the step shown in FIG. 24 in the method of manufacturing a photovoltaic device in accordance with Embodiment 4.

As shown in FIG. 25, the etching paste 21 is applied to the liquid-repelling layer 16b in the method of manufacturing the photovoltaic device 1c in accordance with the present embodiment. This structure can make the etching paste 21 less likely to spread on the liquid-repelling layer 16b beyond a designed range, thereby achieving precise patterning of the first amorphous semiconductor layer 13 of the first conductivity type. As shown in FIG. 26, the contact angle, θ, between the surface of the liquid-repelling layer 16b and the etching paste 21 may be from 45° to 135° inclusive.

An exemplary component of the etching paste 21 capable of etching the liquid-repelling layer 16b, the first amorphous semiconductor layer 13, and the first i-type amorphous semiconductor layer 12 is phosphoric acid. The etching paste 21 of the present embodiment may be the same as the etching paste 21 of Embodiment 1.

Figure 27:
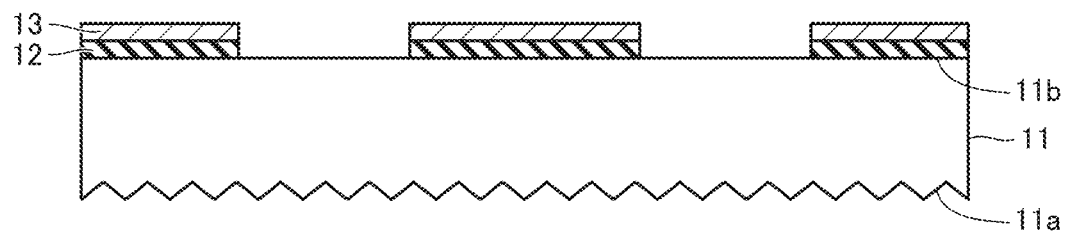
FIG. 27 is a schematic cross-sectional view showing a step next to the one shown in FIG. 26 in the method of manufacturing a photovoltaic device in accordance with Embodiment 4.

As shown in FIG. 27, the liquid-repelling layer 16b and the first amorphous semiconductor layer 13 are partially removed using the etching paste 21. In the manufacture of the photovoltaic device 1c including the first i-type amorphous semiconductor layer 12, the liquid-repelling layer 16b, the first amorphous semiconductor layer 13, and the first i-type amorphous semiconductor layer 12 are partially removed using the etching paste 21. The step shown in FIG. 27 may be the same as the step shown in FIG. 9. In the method of manufacturing the photovoltaic device 1c in accordance with the present embodiment, the liquid-repelling layer 16b may be entirely removed after the partial removal of the first amorphous semiconductor layer 13.

Figure 28:
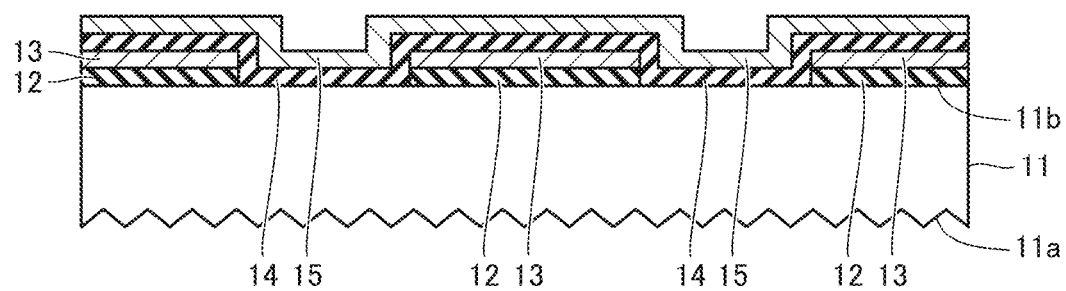
FIG. 28 is a schematic cross-sectional view showing a step next to the one shown in FIG. 27 in the method of manufacturing a photovoltaic device in accordance with Embodiment 4.

As shown in FIG. 28, a second amorphous semiconductor layer 15 of a second conductivity type, which differs from the first conductivity type, is formed above the first amorphous semiconductor layer 13 and on those parts of the second face 11b of the semiconductor substrate 11 from which the first amorphous semiconductor layer 13 has been removed. The step shown in FIG. 28 may be the same as the step shown in FIG. 10, except for the provision of the liquid-repelling layer 16.

Figure 29:
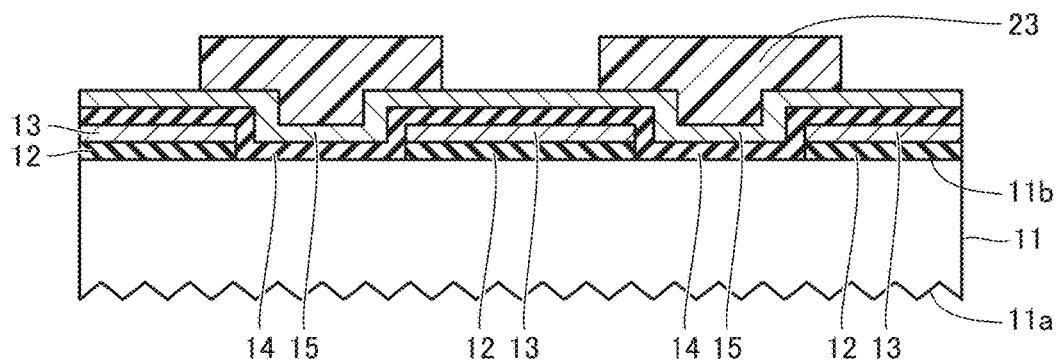
FIG. 29 is a schematic cross-sectional view showing a step next to the one shown in FIG. 28 in the method of manufacturing a photovoltaic device in accordance with Embodiment 4.
Figure 30:
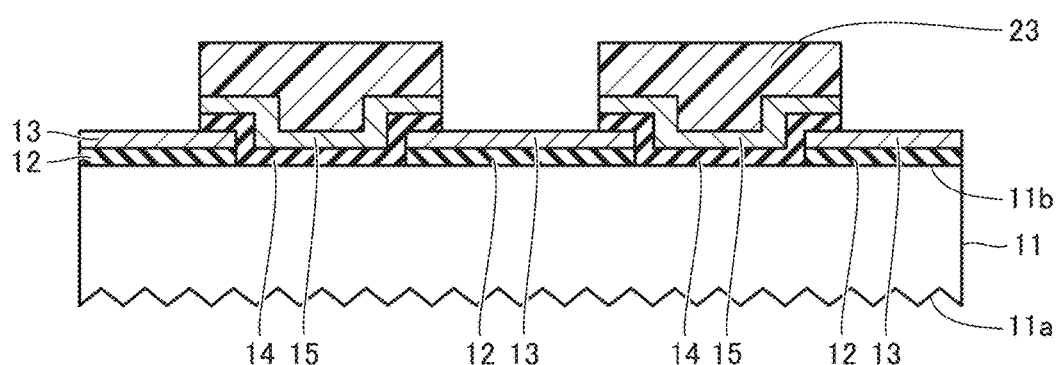
FIG. 30 is a schematic cross-sectional view showing a step next to the one shown in FIG. 29 in the method of manufacturing a photovoltaic device in accordance with Embodiment 4.
Figure 31:
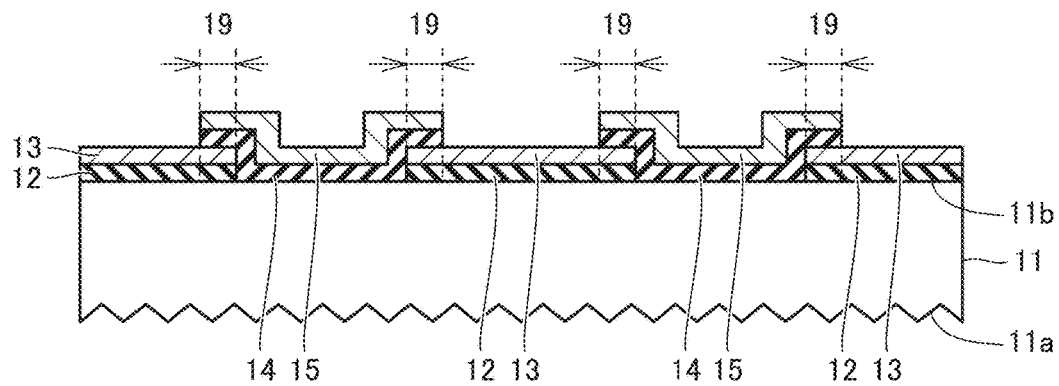
FIG. 31 is a schematic cross-sectional view showing a step next to the one shown in FIG. 30 in the method of manufacturing a photovoltaic device in accordance with Embodiment 4.

As shown in FIGS. 29 to 31, the second amorphous semiconductor layer 15 is partially removed. To manufacture the photovoltaic device 1c including a second i-type amorphous semiconductor layer 14, the second amorphous semiconductor layer 15 and the second i-type amorphous semiconductor layer 14 are partially removed.

Specifically, as shown in FIG. 29, an etching mask 23 is provided on parts of the second amorphous semiconductor layer 15. The etching mask 23 is provided in and above the openings shown in FIG. 27 as well as on the edges of the first amorphous semiconductor layer 13. The etching mask 23 may be provided on parts of the second amorphous semiconductor layer 15 by a method such as photolithography or application of a masking paste.

As shown in FIG. 30, those parts of the second amorphous semiconductor layer 15 and the second i-type amorphous semiconductor layer 14 which are not covered by the etching mask 23 are removed by a method such as dry etching or wet etching. As shown in FIG. 31, the etching mask 23 is removed to expose the surface of the second amorphous semiconductor layer 15. The second amorphous semiconductor layer 15 has edges thereof over the edges of the first amorphous semiconductor layer 13. The edges of the second amorphous semiconductor layer 15 are positioned above the edges of the first amorphous semiconductor layer 13.

Figure 32:
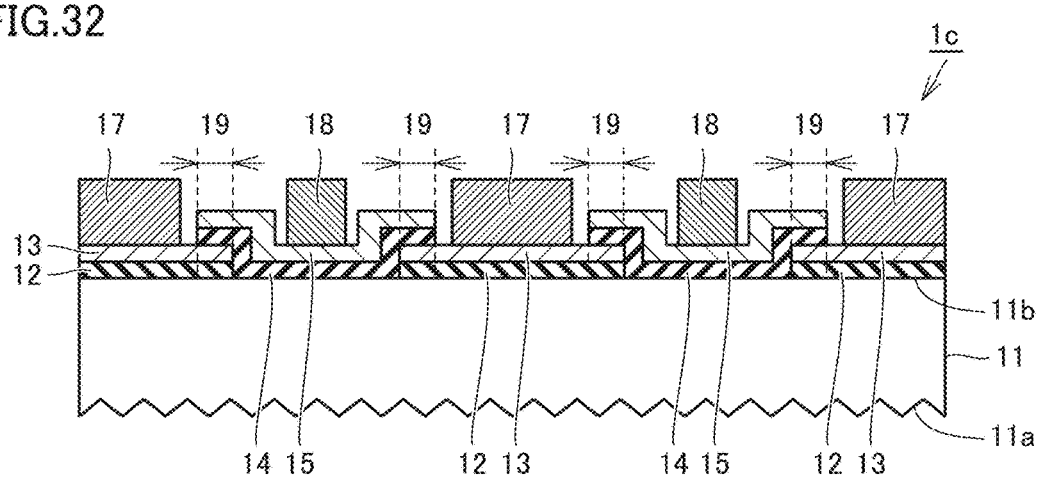
FIG. 32 is a schematic cross-sectional view of a photovoltaic device in accordance with Embodiment 4.

As shown in FIG. 32, the first electrodes 17 are provided in electric connection with the first amorphous semiconductor layer 13 on the second face 11b of the semiconductor substrate 11. The second electrodes 18 are provided on the second amorphous semiconductor layer 15 on the second face 11b of the semiconductor substrate 11. That can conclude the manufacture of the photovoltaic device 1c of the present embodiment shown in FIG. 32.

The method of manufacturing the photovoltaic device 1c in accordance with the present embodiment has the same effects as the method of manufacturing the photovoltaic device 1 in accordance with Embodiment 1, except for the following points.

In the method of manufacturing the photovoltaic device 1c in accordance with the present embodiment, the forming of the liquid-repelling layer 16b on the first amorphous semiconductor layer 13 may encompass the subjecting of the surface of the first amorphous semiconductor layer 13 to a liquid-repelling process. The liquid-repelling layer 16b formed by performing a liquid-repelling process on the surface of the first amorphous semiconductor layer allows the etching paste 21 to spread less thereon than does the first amorphous semiconductor layer 13 not subjected to a liquid-repelling process. In other words, the contact angle between the etching paste 21 and the surface of the liquid-repelling layer 16b formed by performing a liquid-repelling process on the surface of the first amorphous semiconductor layer 13 is greater than the contact angle between the etching paste 21 and the surface of the first amorphous semiconductor layer 13 not subjected to a liquid-repelling process. This structure, formed by the method of manufacturing the photovoltaic device 1c in accordance with the present embodiment, can therefore make the etching paste 21 less likely to spread on the liquid-repelling layer 16b beyond a designed range, thereby achieving precise patterning of the first amorphous semiconductor layer 13 of the first conductivity type.

In the method of manufacturing the photovoltaic device 1c in accordance with the present embodiment, the subjecting of the surface of the first amorphous semiconductor layer 13 to a liquid-repelling process may encompass the exposing of the surface of the first amorphous semiconductor layer 13 to a silylating agent. The liquid-repelling layer 16b formed by exposing the surface of the first amorphous semiconductor layer 13 to a silylating agent allows the etching paste 21 to spread less thereon than does the first amorphous semiconductor layer 13 not exposed to a silylating agent. In other words, the contact angle between the etching paste 21 and the surface of the liquid-repelling layer 16b formed by exposing the surface of the first amorphous semiconductor layer 13 to a silylating agent is greater than the contact angle between the etching paste 21 and the surface of the first amorphous semiconductor layer 13 not exposed to a silylating agent. This structure, formed by the method of manufacturing the photovoltaic device 1c in accordance with the present embodiment, can therefore make the etching paste 21 less likely to spread on the liquid-repelling layer 16b beyond a designed range, thereby achieving precise patterning of the first amorphous semiconductor layer 13 of the first conductivity type.

In the method of manufacturing the photovoltaic device 1c in accordance with the present embodiment, the silylating agent may contain hexamethyldisilazane (HMDS). The liquid-repelling layer 16b formed by exposing the surface of the first amorphous semiconductor layer 13 to hexamethyldisilazane (HMDS) allows the etching paste 21 to spread less thereon than does the first amorphous semiconductor layer 13 not exposed to hexamethyldisilazane (HMDS). In other words, the contact angle between the etching paste 21 and the surface of the liquid-repelling layer 16b formed by exposing the surface of the first amorphous semiconductor layer 13 to hexamethyldisilazane (HMDS) is greater than the contact angle between the etching paste 21 and the surface of the first amorphous semiconductor layer 13 not exposed to hexamethyldisilazane (HMDS). This arrangement of the method of manufacturing the photovoltaic device 1c in accordance with the present embodiment can therefore make the etching paste 21 less likely to spread on the liquid-repelling layer 16b beyond a designed range, thereby achieving precise patterning of the first amorphous semiconductor layer 13 of the first conductivity type.

Additional Remarks (1) An embodiment disclosed here is related to a photovoltaic device including: a semiconductor substrate having a first face and a second face opposite the first face; a first amorphous semiconductor layer of a first conductivity type provided on the second face; and a second amorphous semiconductor layer of a second conductivity type provided on the second face, the second conductivity type differing from the first conductivity type. In the photovoltaic device in accordance with the embodiment disclosed here, the second amorphous semiconductor layer has edges thereof over edges of the first amorphous semiconductor layer. The photovoltaic device in accordance with the embodiment disclosed here further includes a liquid-repelling layer provided between the edges of the first amorphous semiconductor layer and the edges of the second amorphous semiconductor layer. No such a liquid-repelling layer is provided between the first amorphous semiconductor layer and the second amorphous semiconductor layer, except between the edges of the first amorphous semiconductor layer and the edges of the second amorphous semiconductor layer. The photovoltaic device in accordance with the embodiment disclosed here further includes: first electrodes provided in electric connection with the first amorphous semiconductor layer on the second face; and second electrodes provided in electric connection with the second amorphous semiconductor layer on the second face.

Since the liquid-repelling layer is disposed on the first amorphous semiconductor layer, the first amorphous semiconductor layer of the first conductivity type can be patterned using a flowable patterning agent such as an etching paste applied to the liquid-repelling layer. Additionally, the etching paste or like flowable patterning agent spreads less on the liquid-repelling layer than on the first amorphous semiconductor layer of the first conductivity type. The liquid-repelling layer can therefore restrain the etching paste or like flowable patterning agent from spreading thereon beyond a designed range. This structure can therefore achieve precise patterning of the first amorphous semiconductor layer of the first conductivity type in the photovoltaic device in accordance with the embodiment disclosed here.

(2) In the photovoltaic device in accordance with an embodiment disclosed here, the first conductivity type may be the p-type, and the liquid-repelling layer may be an n-type semiconductor layer. Since the liquid-repelling layer, which is an n-type semiconductor layer, is disposed on the first amorphous semiconductor layer, the p-type, first amorphous semiconductor layer can be patterned using a flowable patterning agent such as an etching paste applied to the liquid-repelling layer. Additionally, the etching paste or like flowable patterning agent spreads less on the liquid-repelling layer, which is an n-type semiconductor layer, than on the p-type, first amorphous semiconductor layer. The liquid-repelling layer can therefore restrain the etching paste or like flowable patterning agent from spreading thereon beyond a designed range. This structure can therefore achieve precise patterning of the p-type, first amorphous semiconductor layer in the photovoltaic device in accordance with the embodiment disclosed here.

(3) In the photovoltaic device in accordance with an embodiment disclosed here, the liquid-repelling layer may be an i-type semiconductor layer. The liquid-repelling layer, which is an i-type semiconductor layer, is disposed on the first amorphous semiconductor layer. The first amorphous semiconductor layer of the first conductivity type can therefore be patterned using a flowable patterning agent such as an etching paste applied to the liquid-repelling layer. Additionally, the etching paste 21 or like flowable patterning agent spreads less on the liquid-repelling layer, which is an i-type semiconductor layer, than on the first amorphous semiconductor layer of the first conductivity type. The liquid-repelling layer can therefore restrain the etching paste or like flowable patterning agent from spreading thereon beyond a designed range. This structure can therefore achieve precise patterning of the first amorphous semiconductor layer 13 of the first conductivity type in the photovoltaic device in accordance with the embodiment disclosed here.

(4) In the photovoltaic device in accordance with an embodiment disclosed here, the liquid-repelling layer may be a silicon nitride layer. The liquid-repelling layer, which is a silicon nitride layer, is disposed on the first amorphous semiconductor layer. The first amorphous semiconductor layer of the first conductivity type can therefore be patterned using a flowable patterning agent such as an etching paste applied to the liquid-repelling layer. Additionally, the etching paste or like flowable patterning agent spreads less on the liquid-repelling layer, which is a silicon nitride layer, than on the first amorphous semiconductor layer of the first conductivity type. The liquid-repelling layer can therefore restrain the etching paste or like flowable patterning agent from spreading thereon beyond a designed range. This structure can therefore achieve precise patterning of the first amorphous semiconductor layer of the first conductivity type in the photovoltaic device in accordance with the embodiment disclosed here.

(5) Another embodiment disclosed here is related to a photovoltaic device including: a semiconductor substrate having a first face and a second face opposite the first face; a p-type, first amorphous semiconductor layer provided on the second face; and an n-type, second amorphous semiconductor layer provided on the second face. In the photovoltaic device in accordance with the embodiment disclosed here, the second amorphous semiconductor layer has edges thereof over edges of the first amorphous semiconductor layer. The photovoltaic device in accordance with the embodiment disclosed here further includes an n-type semiconductor layer provided between the edges of the first amorphous semiconductor layer and the edges of the second amorphous semiconductor layer. No such an n-type semiconductor layer is provided between the first amorphous semiconductor layer and the second amorphous semiconductor layer, except between the edges of the first amorphous semiconductor layer and the edges of the second amorphous semiconductor layer. The photovoltaic device in accordance with the embodiment disclosed here further includes: first electrodes provided in electric connection with the first amorphous semiconductor layer on the second face; and second electrodes provided in electric connection with the second amorphous semiconductor layer on the second face.

Since the n-type semiconductor layer is disposed on the first amorphous semiconductor layer, the p-type, first amorphous semiconductor layer can be patterned using a flowable patterning agent such as an etching paste applied to the n-type semiconductor layer. Additionally, the etching paste or like flowable patterning agent spreads less on the n-type semiconductor layer than on the p-type, first amorphous semiconductor layer. The n-type semiconductor layer can therefore restrain the etching paste or like flowable patterning agent from spreading thereon beyond a designed range. This structure can therefore achieve precise patterning of the p-type, first amorphous semiconductor layer in the photovoltaic device in accordance with the embodiment disclosed here.

(6) A further embodiment disclosed here is related to a photovoltaic device including: a semiconductor substrate having a first face and a second face opposite the first face; a first amorphous semiconductor layer of a first conductivity type provided on the second face; and a second amorphous semiconductor layer of a second conductivity type provided on the second face, the second conductivity type differing from the first conductivity type. The second amorphous semiconductor layer has edges thereof over edges of the first amorphous semiconductor layer. The photovoltaic device in accordance with the embodiment disclosed here further includes an i-type semiconductor layer provided between the edges of the first amorphous semiconductor layer and the edges of the second amorphous semiconductor layer. No such an i-type semiconductor layer is provided between the first amorphous semiconductor layer and the second amorphous semiconductor layer, except between the edges of the first amorphous semiconductor layer and the edges of the second amorphous semiconductor layer. The photovoltaic device in accordance with the embodiment disclosed here further includes: first electrodes provided in electric connection with the first amorphous semiconductor layer on the second face; and second electrodes provided in electric connection with the second amorphous semiconductor layer on the second face.

Since the i-type semiconductor layer is disposed on the first amorphous semiconductor layer, the first amorphous semiconductor layer of the first conductivity type can be patterned using a flowable patterning agent such as an etching paste applied to the i-type semiconductor layer. Additionally, the etching paste or like flowable patterning agent spreads less on the i-type semiconductor layer than on the first amorphous semiconductor layer of the first conductivity type. The i-type semiconductor layer can therefore restrain the etching paste or like flowable patterning agent from spreading thereon beyond a designed range. This structure can therefore achieve precise patterning of the first amorphous semiconductor layer of the first conductivity type in the photovoltaic device in accordance with the embodiment disclosed here.

(7) Still another embodiment disclosed here is related to a photovoltaic device including: a semiconductor substrate having a first face and a second face opposite the first face; a first amorphous semiconductor layer of a first conductivity type provided on the second face; and a second amorphous semiconductor layer of a second conductivity type provided on the second face, the second conductivity type differing from the first conductivity type. The second amorphous semiconductor layer has edges thereof over edges of the first amorphous semiconductor layer. The photovoltaic device in accordance with the embodiment disclosed here further includes a silicon nitride layer provided between the edges of the first amorphous semiconductor layer and the edges of the second amorphous semiconductor layer. No such a silicon nitride layer is provided between the first amorphous semiconductor layer and the second amorphous semiconductor layer, except between the edges of the first amorphous semiconductor layer and the edges of the second amorphous semiconductor layer. The photovoltaic device in accordance with the embodiment disclosed here further includes: first electrodes provided in electric connection with the first amorphous semiconductor layer on the second face; and second electrodes provided in electric connection with the second amorphous semiconductor layer on the second face.

Since the silicon nitride layer is disposed on the first amorphous semiconductor layer, the first amorphous semiconductor layer of the first conductivity type can be patterned using a flowable patterning agent such as an etching paste applied to the silicon nitride layer. Additionally, the etching paste or like flowable patterning agent spreads less on the silicon nitride layer than on the first amorphous semiconductor layer of the first conductivity type. The silicon nitride layer can therefore restrain the etching paste or like flowable patterning agent from spreading thereon beyond a designed range. This structure can therefore achieve precise patterning of the first amorphous semiconductor layer of the first conductivity type in the photovoltaic device in accordance with the embodiment disclosed here.

(8) The photovoltaic device in accordance with an embodiment disclosed here may further include a first i-type amorphous semiconductor layer between the semiconductor substrate and the first amorphous semiconductor layer. The first i-type amorphous semiconductor layer can reduce recombination, on the second face of the semiconductor substrate, of the carriers generated in the semiconductor substrate by the light entering the semiconductor substrate through the first face. This structure of the photovoltaic device in accordance with the embodiment disclosed here can therefore improve efficiency of conversion of light energy to electric energy.

(9) The photovoltaic device in accordance with an embodiment disclosed here may further include a second i-type amorphous semiconductor layer between the semiconductor substrate and the second amorphous semiconductor layer. The second i-type amorphous semiconductor layer can reduce recombination, on the second face of the semiconductor substrate, of the carriers generated in the semiconductor substrate by the light entering the semiconductor substrate through the first face. This structure of the photovoltaic device in accordance with the embodiment disclosed here can therefore improve efficiency of conversion of light energy to electric energy. In addition, the first amorphous semiconductor layer and the second amorphous semiconductor layer are isolated from each other by the second i-type amorphous semiconductor layer. In other words, the first amorphous semiconductor layer is not in contact with the second amorphous semiconductor layer. This structure of the photovoltaic device in accordance with the embodiment disclosed here can therefore improve efficiency of conversion of light energy to electric energy.

(10) The photovoltaic device in accordance with an embodiment disclosed here may include an irregular structure on the first face of the semiconductor substrate to reduce optical reflectance on the first face. The provision of the irregular structure on the first face, which is a light-incident face, of the semiconductor substrate can enable admission of more light into the photovoltaic device. This structure of the photovoltaic device in accordance with the embodiment disclosed here can therefore improve efficiency of conversion of light energy to electric energy.

(11) An embodiment disclosed here is related to a method of manufacturing a photovoltaic device, the method including: preparing a semiconductor substrate having a first face and a second face opposite the first face; and forming a first amorphous semiconductor layer of a first conductivity type on the second face of the semiconductor substrate. The method of manufacturing a photovoltaic device in accordance with the embodiment disclosed here further includes: forming a liquid-repelling layer on the first amorphous semiconductor layer; applying an etching paste to the liquid-repelling layer; and removing parts of the liquid-repelling layer and the first amorphous semiconductor layer using the etching paste. The method of manufacturing a photovoltaic device in accordance with the embodiment disclosed here further includes: forming a second amorphous semiconductor layer of a second conductivity type above the first amorphous semiconductor layer and on those parts of the second face of the semiconductor substrate from which the first amorphous semiconductor layer has been removed, the second conductivity type differing from the first conductivity type; removing parts of the second amorphous semiconductor layer; and removing parts of the liquid-repelling layer. The method of manufacturing a photovoltaic device in accordance with the embodiment disclosed here further includes: providing first electrodes in electric connection with the first amorphous semiconductor layer on the second face; and providing second electrodes in electric connection with the second amorphous semiconductor layer on the second face.

The liquid-repelling layer allows the etching paste to spread less thereon than does the first amorphous semiconductor layer. In other words, the contact angle between the surface of the liquid-repelling layer and the etching paste is greater than the contact angle between the surface of the first amorphous semiconductor layer and the etching paste. This structure, formed by the method of manufacturing a photovoltaic device in accordance with the embodiment disclosed here, can therefore make the etching paste less likely to spread on the liquid-repelling layer beyond a designed range, thereby achieving precise patterning of the first amorphous semiconductor layer of the first conductivity type.

(12) In the method of manufacturing a photovoltaic device in accordance with an embodiment disclosed here, the first conductivity type may be the p-type, and the liquid-repelling layer may be an n-type semiconductor layer. The liquid-repelling layer, which is an n-type semiconductor layer, allows the etching paste to spread less thereon than does the p-type, first amorphous semiconductor layer. In other words, the contact angle between the surface of the liquid-repelling layer, which is an n-type semiconductor layer, and the etching paste is greater than the contact angle between the surface of the p-type, first amorphous semiconductor layer and the etching paste. This structure, formed by the method of manufacturing a photovoltaic device in accordance with the embodiment disclosed here, can therefore make the etching paste less likely to spread on the liquid-repelling layer beyond a designed range, thereby achieving precise patterning of the p-type, first amorphous semiconductor layer.

(13) In the method of manufacturing a photovoltaic device in accordance with an embodiment disclosed here, the liquid-repelling layer may be an i-type semiconductor layer. The liquid-repelling layer, which is an i-type semiconductor layer, allows the etching paste to spread less thereon than does the first amorphous semiconductor layer of the first conductivity type. In other words, the contact angle between the surface of the liquid-repelling layer, which is an i-type semiconductor layer, and the etching paste is greater than the contact angle between the surface of the first amorphous semiconductor layer of the first conductivity type and the etching paste. This structure, formed by the method of manufacturing a photovoltaic device in accordance with the embodiment disclosed here, can therefore make the etching paste less likely to spread on the liquid-repelling layer beyond a designed range, thereby achieving precise patterning of the first amorphous semiconductor layer of the first conductivity type.

(14) In the method of manufacturing a photovoltaic device in accordance with an embodiment disclosed here, the liquid-repelling layer may be a silicon nitride layer. The liquid-repelling layer, which is a silicon nitride layer, allows the etching paste to spread less thereon than does the first amorphous semiconductor layer of the first conductivity type. In other words, the contact angle between the surface of the liquid-repelling layer, which is a silicon nitride layer, and the etching paste is greater than the contact angle between the surface of the first amorphous semiconductor layer of the first conductivity type and the etching paste. This structure, formed by the method of manufacturing a photovoltaic device in accordance with the embodiment disclosed here, can therefore make the etching paste less likely to spread on the liquid-repelling layer beyond a designed range, thereby achieving precise patterning of the first amorphous semiconductor layer of the first conductivity type.

(15) In the method of manufacturing a photovoltaic device in accordance with an embodiment disclosed here, the forming of the liquid-repelling layer on the first amorphous semiconductor layer may encompass the subjecting of the surface of the first amorphous semiconductor layer to a liquid-repelling process. The liquid-repelling layer formed by performing a liquid-repelling process on the surface of the first amorphous semiconductor layer allows the etching paste to spread less thereon than does the first amorphous semiconductor layer not subjected to a liquid-repelling process. In other words, the contact angle between the etching paste and the surface of the liquid-repelling layer formed by performing a liquid-repelling process on the surface of the first amorphous semiconductor layer is greater than the contact angle between the etching paste and the surface of the first amorphous semiconductor layer not subjected to a liquid-repelling process. This structure, formed by the method of manufacturing a photovoltaic device in accordance with the embodiment disclosed here, can therefore make the etching paste less likely to spread on the liquid-repelling layer beyond a designed range, thereby achieving precise patterning of the first amorphous semiconductor layer of the first conductivity type.

(16) In the method of manufacturing a photovoltaic device in accordance with an embodiment disclosed here, the subjecting of the surface of the first amorphous semiconductor layer to a liquid-repelling process may encompass the exposing of the surface of the first amorphous semiconductor layer to a silylating agent. The liquid-repelling layer formed by exposing the surface of the first amorphous semiconductor layer to a silylating agent allows the etching paste to spread less thereon than does the first amorphous semiconductor layer not exposed to a silylating agent. In other words, the contact angle between the etching paste and the surface of the liquid-repelling layer formed by exposing the surface of the first amorphous semiconductor layer to a silylating agent is greater than the contact angle between the etching paste and the surface of the first amorphous semiconductor layer not exposed to a silylating agent. This structure, formed by the method of manufacturing a photovoltaic device in accordance with the embodiment disclosed here, can therefore make the etching paste less likely to spread on the liquid-repelling layer beyond a designed range, thereby achieving precise patterning of the first amorphous semiconductor layer of the first conductivity type.

(17) In the method of manufacturing a photovoltaic device in accordance with an embodiment disclosed here, the silylating agent may contain hexamethyldisilazane (HMDS). The liquid-repelling layer formed by exposing the surface of the first amorphous semiconductor layer to hexamethyldisilazane allows the etching paste to spread less thereon than does the first amorphous semiconductor layer not exposed to hexamethyldisilazane. In other words, the contact angle between the etching paste and the surface of the liquid-repelling layer formed by exposing the surface of the first amorphous semiconductor layer to hexamethyldisilazane is greater than the contact angle between the etching paste and the surface of the first amorphous semiconductor layer not exposed to hexamethyldisilazane. This arrangement of the method of manufacturing a photovoltaic device in accordance with the embodiment disclosed here can therefore make the etching paste less likely to spread on the liquid-repelling layer beyond a designed range, thereby achieving precise patterning of the first amorphous semiconductor layer of the first conductivity type.

(18) In the method of manufacturing a photovoltaic device in accordance with an embodiment disclosed here, the contact angle between the surface of the liquid-repelling layer and the etching paste may be from 45° to 135° inclusive. The contact angle between the surface of the liquid-repelling layer and the etching paste, being greater than or equal to 45°, can restrain the etching paste from spreading on the liquid-repelling layer beyond a designed range. The contact angle between the surface of the liquid-repelling layer and the etching paste, being less than or equal to 135°, can restrain the etching paste applied to the surface of the liquid-repelling layer from holding back and thereby excessively reducing the parts of the first amorphous semiconductor layer that are removed by the etching paste. This arrangement of the method of manufacturing a photovoltaic device in accordance with the embodiment disclosed here can therefore achieve precise patterning of the first amorphous semiconductor layer of the first conductivity type.

(19) In the method of manufacturing a photovoltaic device in accordance with an embodiment disclosed here, the etching paste may contain phosphoric acid. Phosphoric acid is difficult to evaporate at normal temperature and even at the heating temperature in the heat treatment. The use of phosphoric acid can therefore restrain those parts of the liquid-repelling layer and the first amorphous semiconductor layer to which no etching paste has been applied from being etched out. The use of an etching paste containing phosphoric acid in the method of manufacturing a photovoltaic device in accordance with the embodiment disclosed here can enable etching of the liquid-repelling layer and the first amorphous semiconductor layer with a high aspect ratio, thereby achieving precise patterning of the first amorphous semiconductor layer of the first conductivity type. In addition, if a heating device is used to etch the liquid-repelling layer and the first amorphous semiconductor layer, the heating device is less likely to be corroded by the etching paste containing phosphoric acid due to phosphoric acid being difficult to evaporate.

(20) The method of manufacturing a photovoltaic device in accordance with an embodiment disclosed here may further include forming a first i-type amorphous semiconductor layer between the semiconductor substrate and the first amorphous semiconductor layer. The first i-type amorphous semiconductor layer can restrict the carriers generated in the semiconductor substrate by the light entering the semiconductor substrate through the first face from recombining on the second face of the semiconductor substrate. This structure, formed by the method of manufacturing a photovoltaic device in accordance with the embodiment disclosed here, can therefore confer improved efficiency of conversion of light energy to electric energy to the resultant photovoltaic device.

(21) The method of manufacturing a photovoltaic device in accordance with an embodiment disclosed here may further include forming a second i-type amorphous semiconductor layer between the semiconductor substrate and the second amorphous semiconductor layer. The second i-type amorphous semiconductor layer can restrict the carriers generated in the semiconductor substrate by the light entering the semiconductor substrate through the first face from recombining on the second face of the semiconductor substrate. This structure, formed by the method of manufacturing a photovoltaic device in accordance with the embodiment disclosed here, can therefore confer improved efficiency of conversion of light energy to electric energy to the resultant photovoltaic device. In addition, the first amorphous semiconductor layer and the second amorphous semiconductor layer are isolated from each other by the second i-type amorphous semiconductor layer. In other words, the first amorphous semiconductor layer is not in contact with the second amorphous semiconductor layer. This structure, formed by the method of manufacturing a photovoltaic device in accordance with the embodiment disclosed here, can therefore improve efficiency of conversion of light energy to electric energy in the resultant photovoltaic device.

(22) The method of manufacturing a photovoltaic device in accordance with an embodiment disclosed here may further include forming an irregular structure on the first face of the semiconductor substrate to reduce optical reflectance on the first face. The provision of the irregular structure on the first face, which is a light-incident face, of the semiconductor substrate can enable admission of more light into the photovoltaic device. This structure, formed by the method of manufacturing a photovoltaic device in accordance with the embodiment disclosed here, can therefore improve efficiency of conversion of light energy to electric energy in the resultant photovoltaic device.

The embodiments and examples disclosed herein are for illustrative purposes only in every respect and provide no basis for restrictive interpretations. For example, in first variation examples of Embodiments 1 to 4, the semiconductor substrate 11, the first amorphous semiconductor layer 13, and the second amorphous semiconductor layer 15 may be replaced respectively by an n-type semiconductor substrate, an n-type amorphous semiconductor layer, and a p-type amorphous semiconductor layer. In second variation examples of Embodiments 1 to 4, the semiconductor substrate 11, the first amorphous semiconductor layer 13, and the second amorphous semiconductor layer 15 may be replaced respectively by a p-type semiconductor substrate, a p-type amorphous semiconductor layer, and an n-type amorphous semiconductor layer. In third variation examples of Embodiments 1 to 4, the semiconductor substrate 11, the first amorphous semiconductor layer 13, and the second amorphous semiconductor layer 15 may be replaced respectively by a p-type semiconductor substrate, an n-type amorphous semiconductor layer, and a p-type amorphous semiconductor layer. The scope of the present invention is defined only by the claims and never bound by the embodiments or examples. Those modifications and variations that may lead to equivalents of claimed elements are all included within the scope of the invention.

REFERENCE SIGNS LIST 1, 1a, 1b, 1c Photovoltaic Device
11 Semiconductor Substrate
11a First Face
11b Second Face
12 First I-type Amorphous Semiconductor Layer
13 First Amorphous Semiconductor Layer
14 Second I-type Amorphous Semiconductor Layer
15 Second Amorphous Semiconductor Layer
16, 16a, 16b Liquid-repelling Layer
17 First Electrode
18 Second Electrode
19 Edge Region
21 Etching Paste
23 Etching Mask

The invention claimed is:

1. A method of manufacturing a photovoltaic device, comprising:
preparing a semiconductor substrate having a first face and a second face opposite the first face;
forming a first amorphous semiconductor layer of a first conductivity type on the second face of the semiconductor substrate;
forming a liquid-repelling layer on the first amorphous semiconductor layer;
applying an etching paste to the liquid-repelling layer;
removing parts of the liquid-repelling layer and the first amorphous semiconductor layer using the etching paste;
forming a second amorphous semiconductor layer of a second conductivity type above the first amorphous semiconductor layer and on those parts of the second face of the semiconductor substrate from which the first amorphous semiconductor layer has been removed, the second conductivity type differing from the first conductivity type, the second amorphous semiconductor layer having edges thereof over edges of the first amorphous semiconductor layer;
removing parts of the second amorphous semiconductor layer;
removing parts of the liquid-repelling layer;
providing first electrodes in electric connection with the first amorphous semiconductor layer on the second face; and
providing second electrodes in electric connection with the second amorphous semiconductor layer on the second face.

2. The method according to claim 1, wherein the etching paste forms a contact angle with a surface of the liquid-repelling layer, the contact angle being from 45° to 135° inclusive.

3. The method according to claim 1, wherein the etching paste contains phosphoric acid.

4. The method according to claim 1, wherein:
the first conductivity type is p-type;
the second conductivity type is n-type;
the liquid-repelling layer is an n-type semiconductor layer; and
no such an n-type semiconductor layer is provided between the first amorphous semiconductor layer and the second amorphous semiconductor layer, except between the edges of the first amorphous semiconductor layer and the edges of the second amorphous semiconductor layer.

5. The method according to claim 1, wherein the forming of a liquid-repelling layer on the first amorphous semiconductor layer comprises subjecting a surface of the first amorphous semiconductor layer to a liquid-repelling process.

6. The method according to claim 5, wherein the subjecting of a surface of the first amorphous semiconductor layer to a liquid-repelling process comprises exposing the surface of the first amorphous semiconductor layer to a silylating agent.

7. The method according to claim 1, further comprising forming a first i-type amorphous semiconductor layer between the semiconductor substrate and the first amorphous semiconductor layer.

8. The method according to claim 1, further comprising forming a second i-type amorphous semiconductor layer between the semiconductor substrate and the second amorphous semiconductor layer.

9. The method according to claim 1, further comprising forming an irregular structure on the first face of the semiconductor substrate, the irregular structure reducing optical reflectance of the first face.

* * * * *